United States Patent
Glassenberg et al.

(10) Patent No.: US 11,928,404 B1
(45) Date of Patent: Mar. 12, 2024

(54) METHODS AND SYSTEMS FOR SIMULATING FLUID MOVEMENT

(71) Applicant: LEVEL EX, INC, Chicago, IL (US)

(72) Inventors: Sam Glassenberg, Evanston, IL (US); Matthew Yeager, Chicago, IL (US)

(73) Assignee: LEVEL EX, INC., Chicago, IL (US)

( * ) Notice: Subject to any disclaimer, the term of this patent is extended or adjusted under 35 U.S.C. 154(b) by 0 days.

(21) Appl. No.: 17/660,137

(22) Filed: Apr. 21, 2022

Related U.S. Application Data

(63) Continuation of application No. 16/169,990, filed on Oct. 24, 2018, now Pat. No. 11,347,905.

(51) Int. Cl.
*G06F 30/20* (2020.01)
*G06T 15/04* (2011.01)
*G06T 17/10* (2006.01)

(52) U.S. Cl.
CPC .............. *G06F 30/20* (2020.01); *G06T 15/04* (2013.01); *G06T 17/10* (2013.01); *G06T 2210/24* (2013.01)

(58) Field of Classification Search
CPC ......... G06F 30/20; G06T 15/04; G06T 17/10; G06T 2210/24
See application file for complete search history.

(56) References Cited

U.S. PATENT DOCUMENTS

| | | | |
|---|---|---|---|
| 5,537,641 A * | 7/1996 | da Vitoria Lobo | G06T 13/60 345/473 |
| 5,891,030 A | 4/1999 | Johnson et al. | |
| 6,266,071 B1 * | 7/2001 | Stam | G06T 13/20 345/473 |
| 8,041,550 B1 * | 10/2011 | Thuerey | G06F 30/20 703/5 |
| 2001/0002131 A1 | 5/2001 | DeRose et al. | |
| 2005/0152588 A1 | 7/2005 | Yoshida et al. | |
| 2006/0074610 A1 * | 4/2006 | Rasmussen | G06T 13/60 703/2 |
| 2008/0012853 A1 | 1/2008 | Geiger | |
| 2008/0120075 A1 * | 5/2008 | Wloka | G06T 13/60 703/9 |
| 2009/0267951 A1 * | 10/2009 | Chang | G06T 15/205 345/474 |
| 2012/0038639 A1 | 2/2012 | Mora et al. | |
| 2013/0300735 A1 | 11/2013 | Schmidt | |
| 2014/0005994 A1 * | 1/2014 | O'Brien | G06G 7/57 703/9 |
| 2015/0104090 A1 | 4/2015 | Hopfgartner et al. | |
| 2016/0224692 A1 | 8/2016 | Stevens et al. | |
| 2019/0080043 A1 | 3/2019 | Buchler et al. | |

FOREIGN PATENT DOCUMENTS

KR 20120110439 A * 10/2012 ............. G06T 15/08

OTHER PUBLICATIONS

Stam, Jos. "Real-time fluid dynamics for games." Proceedings of the game developer conference. vol. 18. 2003. (Year: 2003).*

(Continued)

*Primary Examiner* — Maurice L. McDowell, Jr.
(74) *Attorney, Agent, or Firm* — DLA PIPER LLP (US)

(57) ABSTRACT

Methods and systems of simulating a fluid. An outflow of the fluid is determined. An inflow of the fluid is determined. Determining a simulated fluid using the inflow and the outflow.

16 Claims, 55 Drawing Sheets

(56) References Cited

OTHER PUBLICATIONS

Yuan, "The application of Computational Fluid Dynamics to tissue bleeding simulation for medical endoscopic image." 2008 International Conference on Machine Learning and Cybernetics. vol. 6. IEEE, 2008. (Year: 2008).*

Zátonyi, János, et al. "Real-time synthesis of bleeding for virtual hysteroscopy." Medical Image Computing and Computer-Assisted Intervention—MICCAI 2003: 6th International Conference, Montreal, Canada, Nov. 15-18, 2003. Proceedings 6. Springer Berlin Heidelberg, 2003. (Year: 2003).*

Crane et al. "Real-time simulation and rendering of 3d fluids." GPU gems 3.1 (2007). (Year: 2007).*

Chentanez et al. "Real-time Eulerian water simulation using a restricted tall cell grid." ACM Siggraph 2011 Papers. 2011. 1-10. (Year: 2011).*

Bresenham, "Bresenham's line algorithm", URL: https://en.wikipedia.org/w/index.php?title=Special:DownloadAsPdf&page=Bresenham%27s_line_algorithm&action=show-download-screen, pp. 10, retrieved from Internet Archive, archived on Aug. 8, 2018, (Printed on Jan. 10, 2022).

"Volume Ray Casting", URL: https://en.wikipedia.org/wiki/Volume_ray_casting, pp. 3, retriev from Internet Archive, archived on Jul. 1, 2017, (Printed on Jan. 10, 2022).

"Signed distance functions", URL: https://en.wikipedia.org/wiki/Signed_distance_function, pp. 4, retrieved from Internet Archive, archived on Nov. 14, 2015, (Printed on Jan. 10, 2022).

"Ray Casting", URL: https://en.wikipedia.org/wiki/Ray_casting, pp. 10, retrieved from Internet Archive, archived on Sep. 19, 2017, (Printed on Jan. 10, 2022).

Drahos, Facial Expression COmposition Using Dynamic Displacement Mapping, SCCG 2011, pp. 21-28, (Apr. 28-20, 2011).

Paloc et al., Online Remeshing for Soft Tissue Simulation in Surgical Training, Virtual and Augmented Reality Simulators, Published by the IEEE COmputer Society, pp. 24-34 (Nov./Dec. 2006).

Hirche et al., Hardware Accelerated Per-Pixel Displacement Mapping, uploaded to ReserachGate, pp. 9, (Jan. 21, 2014).

* cited by examiner

```
1   Shader "Custom/Fluid/BresenhamOffsets"
2   {
3       Properties {}
4       SubShader
5       {
6           // No culling or depth
7           Cull Off ZWrite Off ZTest Always
8
9           Pass
10          {
11              CGPROGRAM
12              #pragma vertex vert
13              #pragma fragment frag
14
15              #include "UnityCG.cginc"
16              #include "Utils.cginc"
17
18              struct appdata
19              {
20                  float4 vertex : POSITION;
21                  float2 uv : TEXCOORD0;
22              };
23
24              struct v2f
25              {
26                  float2 uv : TEXCOORD0;
27                  float4 vertex : SV_POSITION;
28              };
29
30              v2f vert (appdata v)
31              {
32                  v2f o;
33                  o.vertex = UnityObjectToClipPos(v.vertex);
34                  o.uv = v.uv;
35                  return o;
36              }
37
38              float2 _Res;
39
40              float getBresenhamYShift(float2 uv) {
41                  float y = (float) remap01ToInteger(uv.y, _Res.y) / _Res.y;
42                  float angle = y * UNITY_PI / 4;
43                  float2 direction = float2(cos(angle), sin(angle));
44
45                  int currentTexelX = int(uv.x * _Res.x);
46
47                  float error = 0;
48                  float slope = direction.y / direction.x;
49                  float yShift = 0;
50                  for (int k=0; k<=currentTexelX; k++) {
51                      error += abs(slope);
52                      yShift = 0;
53                      if (error >= 0.5) {
54                          yShift = 1;
55                          error -= 1.0;
56                      }
57                  }
58
59                  return yShift;
60              }
61
62              float4 frag (v2f i) : SV_Target
63              {
64                  float shift = getBresenhamYShift(i.uv);
65                  return float4(shift, shift, shift, 1);
66              }
67              ENDCG
68          }
69      }
```

```csharp
using UnityEngine;
using System.Collections;

public class Fluid : MonoBehaviour
{
    public Shader FlowShader;
    public Shader AdvectionShader;
    public Shader BlurShader;
    public Shader SmearShader;
    public Shader InitFluidShader;
    public Shader BresenhamOffsetShader;
    public Shader DiffusionShader;

//Referenced in RenderPipeline; it's a property of fluid sim but RTCompositor
    actually consumes it
    [Range(0, 1)] public float FluidDisplacementVolume = 1.0f;

[System.NonSerialized] public bool paused = false;
    [System.NonSerialized] public bool stepRequested = false;
    [System.NonSerialized] public bool clearRequested = false;

private Material flowMaterial;
    private Material advectionMaterial;
    private Material blurMaterial;
    private Material smearMaterial;
    private Material initFluidMaterial;
    private Material bresenhamOffsetMaterial;
    private Material diffusionMaterial;

private RenderTexture worldNormals, worldTangents, worldPositions;
    private RenderTexture flowRT, bresenhamOffsets;
    private RenderTexture ping, pong, src, dst, swap, blur;

private RenderTextureManager rtManager;

private const int BRESENHAM_RES = 256; //Number of possible advection directions
    will be quantized to approx 8*BRESENHAM_RES void Start ()
    {
        rtManager = LevelGameObjects.instance.renderTextureManager;

flowMaterial = new Material(FlowShader);
        advectionMaterial = new Material(AdvectionShader);
        blurMaterial = new Material(BlurShader);
        smearMaterial = new Material(SmearShader);
        initFluidMaterial = new Material(InitFluidShader);
        bresenhamOffsetMaterial = new Material(BresenhamOffsetShader);
        diffusionMaterial = new Material(DiffusionShader);

//Will be immediately resized by QualityChanged
        ping = new RenderTexture(8, 8, 0, RenderTextureFormat.ARGBHalf);
        pong = new RenderTexture(8, 8, 0, RenderTextureFormat.ARGBHalf);
        blur = new RenderTexture(8, 8, 0, RenderTextureFormat.ARGBHalf);
        ping.useMipMap = true;
        pong.useMipMap = true;
        ping.autoGenerateMips = false;
        pong.autoGenerateMips = false;
        ping.filterMode = FilterMode.Point;
        pong.filterMode = FilterMode.Point;
        blur.filterMode = FilterMode.Point;
        ping.wrapMode = TextureWrapMode.Repeat;
        pong.wrapMode = TextureWrapMode.Repeat;
        blur.wrapMode = TextureWrapMode.Repeat;
        src = ping;
        dst = pong;

flowRT = rtManager.RT_Flow;
```

FIG. 6A

```
 68         bresenhamOffsets = new RenderTexture(8, 8, 0, RenderTextureFormat.R8);
 69         bresenhamOffsets.filterMode = FilterMode.Point;
 70
 71         clearRequested = true;
 72
 73         GameManager.instance.qualityManager.qualityChangedEvent += QualityChanged;
 74     }
 75
 76     void OnDestroy()
 77     {
 78         GameManager.instance.qualityManager.qualityChangedEvent -= QualityChanged;
 79     }
 80
 81     public void QualityChanged(QualityManager.GraphicsSettings settings)
 82     {
 83         if (GameManager.instance.qualityManager.useVerboseLogging)
 84             Debug.Log("Updating graphics settings: Fluid");
 85
 86         InitRts(settings.fluidResolution);
 87     }
 88
 89     void InitRts(int resolution)
 90     {
 91         if (resolution != ping.width)
 92         {
 93             ping.Release();
 94             pong.Release();
 95             blur.Release();
 96             bresenhamOffsets.Release();
 97             ping.width  = resolution;
 98             pong.width  = resolution;
 99             blur.width  = resolution;
100             ping.height = resolution;
101             pong.height = resolution;
102             blur.height = resolution;
103             bresenhamOffsets.width  = resolution;
104             bresenhamOffsets.height = BRESENHAM_RES;
105             ping.Create();
106             pong.Create();
107             blur.Create();
108             bresenhamOffsets.Create();
109
110             clearRequested = true;
111         }
112     }
113
114     void PickSourceRTs()
115     {
116         if
           (GameManager.instance.qualityManager.currentGraphicsSettings.enableFluidSmoothing
           )
117         {
118             worldPositions = rtManager.RT_WorldPosition_Unfiltered;
119             worldNormals   = rtManager.RT_WorldNormal_Unfiltered;
120             worldTangents  = rtManager.RT_WorldTangent_Unfiltered;
121         }
122         else
123         {
124             worldPositions = rtManager.RT_WorldPosition;
125             worldNormals   = rtManager.RT_WorldNormal;
126             worldTangents  = rtManager.RT_WorldTangent;
127         }
128     }
129
130     void GenerateBresenhamOffsets()
131     {
132         bresenhamOffsetMaterial.SetVector("_Res", new Vector2(bresenhamOffsets.width,
           bresenhamOffsets.height));
133         Graphics.Blit(null, bresenhamOffsets, bresenhamOffsetMaterial);
```

FIG. 6B

```
        } public void Render()
    {
        if (clearRequested ||
        !GameManager.instance.qualityManager.currentGraphicsSettings.enableFluidSimulatio
        n) {
            InitializeRtContents();
            clearRequested = false;
        }
        else if (!paused || stepRequested)
        {
            PickSourceRTs();
            GenerateFlowMap();
            Simulate();
//          Diffuse();
            SmearBlur();
            CopyToOutputRT();
            stepRequested = false;
        }
    } public void GenerateFlowMap()
    {
        flowMaterial.SetTexture("_WorldNormal", worldNormals);
        flowMaterial.SetTexture("_WorldTangent", worldTangents);
        Graphics.Blit(null, flowRT, flowMaterial);
        flowRT.GenerateMips();
    } void Simulate()
    {
        src.filterMode = FilterMode.Point;
        dst.filterMode = FilterMode.Point;
        src.wrapMode = TextureWrapMode.Repeat;
        dst.wrapMode = TextureWrapMode.Repeat;

advectionMaterial.SetTexture("_Flow", flowRT);
        advectionMaterial.SetTexture("_BresenhamOffsets", bresenhamOffsets);
        advectionMaterial.SetTexture("_FluidVolume", src);
        advectionMaterial.SetTexture("_WorldPositions", worldPositions);
        advectionMaterial.SetTexture("_FluidSources", rtManager.RT_FluidSources);
        Graphics.Blit(null, dst, advectionMaterial);
        Swap();

#if UNITY_EDITOR
            if (Input.GetKey(KeyCode.Z))
            {
                initFluidMaterial.SetTexture("_WorldPosition",
                rtManager.RT_WorldPosition_PreManipulator);
//              initFluidMaterial.SetFloat("_TargetDepth", Knobs.Get(14, -5, 5));
                //Safe to uncomment if Thew's knob server is available
                initFluidMaterial.SetFloat("_DisplacementVolume",
                FluidDisplacementVolume);
                Graphics.Blit(null, src, initFluidMaterial);
                Graphics.Blit(null, dst, initFluidMaterial);
            } if (Input.GetKey(KeyCode.X))
            {
                InitializeRtContents();
            }
        #endif
    } void Diffuse()
    {
        //Currently fails on iOS for unknown reasons; will need to reenable and debug
        when
```

FIG. 6C

```
197            //fluid mixture becomes more important
198            diffusionMaterial.SetTexture("_FluidVolume", src);
199            Graphics.Blit(null, dst, diffusionMaterial);
200            Swap();
201        }
202
203        void Smear()
204        {
205            RenderTexture smear = rtManager.RT_FluidBlurred;
206            RenderTexture prevFrame = RenderTexture.GetTemporary(smear.width, smear.height,
                   smear.depth, smear.format);
207            Graphics.Blit(smear, prevFrame);
208            smearMaterial.SetTexture("_Old", prevFrame);
209            smearMaterial.SetTexture("_New", src);
210            smearMaterial.SetTexture("_Flow", flowRT);
211            Graphics.Blit(null, smear, smearMaterial);
212            RenderTexture.ReleaseTemporary(prevFrame);
213        }
214
215        void SmearBlur()
216        {
217            RenderTexture smearBlurred = rtManager.RT_FluidBlurred;
218            RenderTexture tmp = RenderTexture.GetTemporary(smearBlurred.width,
                   smearBlurred.height, smearBlurred.depth, smearBlurred.format);
219            smearMaterial.SetTexture("_Old", smearBlurred);
220            smearMaterial.SetTexture("_New", src);
221            smearMaterial.SetTexture("_Flow", flowRT);
222            Graphics.Blit(null, tmp, smearMaterial);
223            Blur(tmp, smearBlurred);
224            RenderTexture.ReleaseTemporary(tmp);
225        }
226
227        void CopyToOutputRT()
228        {
229            Graphics.Blit(src, rtManager.RT_Fluid);
230        }
231
232        void Blur()
233        {
234            src.filterMode  = FilterMode.Bilinear;
235            blur.filterMode = FilterMode.Bilinear;
236            src.wrapMode  = TextureWrapMode.Repeat;
237            blur.wrapMode = TextureWrapMode.Repeat;
238
239            blurMaterial.SetVector("_BlurDirection", Vector2.right);
240            Graphics.Blit(rtManager.RT_FluidBlurred, blur, blurMaterial);
241
242            blur.wrapMode = TextureWrapMode.Clamp;
243            blurMaterial.SetVector("_BlurDirection", Vector2.up);
244            Graphics.Blit(blur, rtManager.RT_FluidBlurred, blurMaterial);
245        }
246
247        void Blur(RenderTexture source, RenderTexture target)
248        {
249            var origFilterMode = source.filterMode;
250            var origWrapMode = source.wrapMode;
251
252            RenderTexture tmp = RenderTexture.GetTemporary(target.width, target.height,
                   target.depth, target.format);
253            source.filterMode = FilterMode.Bilinear;
254            tmp.filterMode = FilterMode.Bilinear;
255            source.wrapMode = TextureWrapMode.Repeat;
256            tmp.wrapMode = TextureWrapMode.Repeat;
257
258            blurMaterial.SetVector("_BlurDirection", Vector2.right);
259            Graphics.Blit(source, tmp, blurMaterial);
260
261            tmp.wrapMode = TextureWrapMode.Clamp;
262            blurMaterial.SetVector("_BlurDirection", Vector2.up);
```

FIG. 6D

```
263            Graphics.Blit(tmp, target, blurMaterial);
264
265            RenderTexture.ReleaseTemporary(tmp);
266            source.filterMode = origFilterMode;
267            source.wrapMode = origWrapMode;
268        }
269
270        RenderTexture BlurToTemp(RenderTexture source)
271        {
272            RenderTexture temp = RenderTexture.GetTemporary(source.width, source.height,
               source.depth, source.format);
273            temp.filterMode = FilterMode.Bilinear;
274            temp.wrapMode = TextureWrapMode.Repeat;
275            Blur(source, temp);
276            return temp;
277        }
278
279        void Swap()
280        {
281            swap = dst;
282            src = dst;
283            dst = swap;
284        }
285
286        void InitializeRtContents()
287        {
288            RenderTexture.active = ping;
289            GL.Clear(false, true, Color.black);
290            RenderTexture.active = pong;
291            GL.Clear(false, true, Color.black);
292            RenderTexture.active = blur;
293            GL.Clear(false, true, Color.black);
294            RenderTexture.active = rtManager.RT_FluidBlurred;
295            GL.Clear(false, true, Color.black);
296
297            ping.GenerateMips();
298            pong.GenerateMips();
299
300            GenerateBresenhamOffsets();
301        }
302    }
303
```

FIG. 6E

```
// Upgrade NOTE: replaced 'mul(UNITY_MATRIX_MVP,*)' with 'UnityObjectToClipPos(*)'

Shader "Custom/Fluid/Advection"
{
    Properties
    {
        _Flow ("Flow", 2D) = "white" {}
        _FluidVolume ("Fluid Volume", 2D) = "black" {}
    }

SubShader
    {

Tags {
            "RenderType" = "Opaque"
            "Queue" = "Transparent+20"
        }

Cull Off ZWrite Off
        Blend One Zero

Pass
        {
            CGPROGRAM
            #pragma vertex vert
            #pragma fragment frag include "UnityCG.cginc"
            #include "Assets/Shaders/Utils.cginc"

sampler2D _Flow;
            sampler2D _BresenhamOffsets;
            sampler2D _FluidVolume;
            sampler2D _WorldPositions;
            sampler2D _FluidSources;
            float4 _FluidVolume_TexelSize;
            float _ShiftDistance;

struct appdata
            {
                float4 vertex : POSITION;
                float2 uv : TEXCOORD0;
            };

struct v2f
            {
                float2 uv : TEXCOORD0;
                float4 vertex : SV_POSITION;
            };

v2f vert (appdata v)
            {
                v2f o;
                o.vertex = UnityObjectToClipPos(v.vertex);
                o.uv = v.uv;
                return o;
            } float nearEqual(float2 a, float2 b) {
                float epsilon = 1.0/127.0 * 2.0;
                float2 absDiff = abs(a-b);
                float xEqual = 1.0 - step(epsilon, absDiff.x);
                float yEqual = 1.0 - step(epsilon, absDiff.y);
                return xEqual * yEqual;
            } float3 getFlow(float2 uv) {
                return tex2D(_Flow, uv).rgb;
            }
```

FIG. 7A

```
float2 getUvOffsetFromFlow(float2 uv) {
    float3 flow = getFlow(uv);
    float2 direction = flow.xy;
    float flowStrength = flow.z;
    float angle = atan2(direction.y, direction.x) + UNITY_PI;
    float octantSelector = fmod(angle / (UNITY_PI * 2), 1) * 8;
    float xDirection, yDirection, xDominant, vInvert;
    float4 octantInfo; //xDirection, yDirection, xDominant, vInvert;
    float4 octant0 = float4( 1,  1, 1, 0);
    float4 octant1 = float4( 1,  1, 0, 1);
    float4 octant2 = float4(-1,  1, 0, 0);
    float4 octant3 = float4(-1,  1, 1, 1);
    float4 octant4 = float4(-1, -1, 1, 0);
    float4 octant5 = float4(-1, -1, 0, 1);
    float4 octant6 = float4( 1, -1, 0, 0);
    float4 octant7 = float4( 1, -1, 1, 1);

octantInfo = octant0;
    octantInfo = lerp(octantInfo, octant1, step(1, octantSelector));
    octantInfo = lerp(octantInfo, octant2, step(2, octantSelector));
    octantInfo = lerp(octantInfo, octant3, step(3, octantSelector));
    octantInfo = lerp(octantInfo, octant4, step(4, octantSelector));
    octantInfo = lerp(octantInfo, octant5, step(5, octantSelector));
    octantInfo = lerp(octantInfo, octant6, step(6, octantSelector));
    octantInfo = lerp(octantInfo, octant7, step(7, octantSelector));

xDirection = octantInfo.x;
    yDirection = octantInfo.y;
    xDominant  = octantInfo.z;
    vInvert    = octantInfo.w;

float sampleV = fmod(octantSelector, 1);
    sampleV = lerp(sampleV, 1-sampleV, vInvert);
    float sampleU = lerp(uv.y, uv.x, xDominant);

float bresenhamOffset = tex2D(_BresenhamOffsets, float2(sampleU, sampleV)).r;
    float2 offset = lerp(float2(bresenhamOffset, 1), float2(1, bresenhamOffset), xDominant);
    float2 directionalOffset = float2(xDirection, yDirection) * -offset;
    return float3(directionalOffset, flowStrength);
} float4 GetOutflow(float2 uv) {
    float epsilon = 0.0001;
    float2 flowOffset = getUvOffsetFromFlow(uv);
    float2 neighborUv = uv + flowOffset * _FluidVolume_TexelSize.xy;

float4 volumes = tex2D(_FluidVolume, uv);
    volumes.ba = 0;
    float totalVolume = max(epsilon, volumes.r + volumes.g + volumes.b + volumes.a);
    float4 weights = volumes / totalVolume;

float currentAltitude = tex2D(_WorldPositions, uv).y;
    float neighborAltitude = tex2D(_WorldPositions, neighborUv).y;

float altitudeDifference = max(0, currentAltitude - neighborAltitude);
    float outflow = min(totalVolume, altitudeDifference/2);

return outflow * weights;
} float4 GetInflow(float2 centerUv, float2 texelOffset)
    {
        float2 uv = centerUv + (texelOffset * _FluidVolume_TexelSize.xy);
        float4 outflow = GetOutflow(uv);
        float2 flowOffset = getUvOffsetFromFlow(uv);
```

FIG. 7B

```
                    outflow = lerp(float4(0, 0, 0, 0), outflow, nearEqual(-texelOffset,
                    flowOffset));
                    return outflow;
                } float4 frag (v2f i) : COLOR
            {
                float2 uv = i.uv + float2(0, _ShiftDistance);

float4 outflow = GetOutflow(uv);
                float4 volume = max(0, tex2D(_FluidVolume, uv) - outflow);

volume += GetInflow(uv, float2( 1,  0));
                volume += GetInflow(uv, float2( 1,  1));
                volume += GetInflow(uv, float2( 0,  1));
                volume += GetInflow(uv, float2(-1,  1));
                volume += GetInflow(uv, float2(-1,  0));
                volume += GetInflow(uv, float2(-1, -1));
                volume += GetInflow(uv, float2( 0, -1));
                volume += GetInflow(uv, float2( 1, -1));

volume += tex2D(_FluidSources, uv);

//Debug fluid sources
//                  float sourceRadius = Knob8*0.01;
//                  float sourceVolume = Knob9*0.1;
//                  float2 sourcePoint = float2(Knob10, Knob11);
//                  float sourceMask = 1-step(sourceRadius, length(uv-sourcePoint));
//                  volume.r += sourceVolume * sourceMask;
//                  sourcePoint.x = 1-sourcePoint.x;
//                  sourceMask = 1-step(sourceRadius, length(uv-sourcePoint));
//                  volume.g += sourceVolume * sourceMask;

float4 zero = float4(0, 0, 0, 0);
                float edgeProtection = _FluidVolume_TexelSize.y;
                volume = lerp(zero, volume, step(edgeProtection, uv.y));
                volume = lerp(volume, zero, step(1-edgeProtection, uv.y));

volume = max(float4(0, 0, 0, 0), volume);

return float4(volume.rg, 0, 1);
            }
            ENDCG
        }
    }
}
```

FIG. 7C

```
// Upgrade NOTE: replaced 'mul(UNITY_MATRIX_MVP,*)' with 'UnityObjectToClipPos(*)'

Shader "Custom/Fluid/Fluid Blur"
{
    Properties
    {
        _MainTex ("Texture", 2D) = "white" {}
        _Perturbation ("Perturbation", Range(0.0, 1.0)) = 0.02
    }
    SubShader
    {
        // No culling or depth
        Cull Off ZWrite Off ZTest Always Pass
        {
            CGPROGRAM
            #pragma vertex vert
            #pragma fragment frag include "UnityCG.cginc"
            #include "Utils.cginc"

struct appdata
            {
                float4 vertex : POSITION;
                float2 uv : TEXCOORD0;
            };

struct v2f
            {
                float2 uv : TEXCOORD0;
                float4 vertex : SV_POSITION;
            };

v2f vert (appdata v)
            {
                v2f o;
                o.vertex = UnityObjectToClipPos(v.vertex);
                o.uv = v.uv;
                return o;
            } sampler2D _MainTex;
            float4 _MainTex_TexelSize;
            float _Perturbation;
            float2 _BlurDirection;

float4 stompSample(sampler2D image, float2 uv, float2 texelSize)
            {
                float4 tex = tex2D(image, uv);
                float4 zero = float4(0,0,0,1);
                float edgeProtection = texelSize.y;
                tex = lerp(zero, tex, step(edgeProtection, uv.y));
                tex = lerp(tex, zero, step(1-edgeProtection, uv.y));
                return tex;
            } float4 blur13(sampler2D image, float2 uv, float2 texelSize, float2 direction) {
                float4 color = float4(0.0, 0.0, 0.0, 0.0);
                float2 off1 = 1.411764705882353 * direction;
                float2 off2 = 3.2941176470588234 * direction;
                float2 off3 = 5.176470588235294 * direction;

color += stompSample(image, uv, texelSize) * 0.1964825501511404;
                color += stompSample(image, uv + (off1 * texelSize), texelSize) * 0.2969069646728344;
                color += stompSample(image, uv - (off1 * texelSize), texelSize) *
```

FIG. 8A

```
                        0.2969069646728344;
68         color += stompSample(image, uv + (off2 * texelSize), texelSize) *
                        0.09447039785044732;
69         color += stompSample(image, uv - (off2 * texelSize), texelSize) *
                        0.09447039785044732;
70         color += stompSample(image, uv + (off3 * texelSize), texelSize) *
                        0.010381362401148057;
71         color += stompSample(image, uv - (off3 * texelSize), texelSize) *
                        0.010381362401148057;
72
73         return color;
74     }
75
76     float4 blur5(sampler2D image, float2 uv, float2 texelSize, float2
           direction) {
77         float4 color = float4(0.0, 0.0, 0.0, 0.0);
78         float2 off1 = 1.3333333333333333 * direction;
79
80         color += stompSample(image, uv, texelSize) * 0.29411764705882354;
81         color += stompSample(image, uv + (off1 * texelSize), texelSize) *
                        0.35294117647058826;
82         color += stompSample(image, uv - (off1 * texelSize), texelSize) *
                        0.35294117647058826;
83
84         return color;
85     }
86
87     float4 blur3(sampler2D image, float2 uv, float2 texelSize, float2
           direction) {
88         float4 color = float4(0.0, 0.0, 0.0, 0.0);
89
90         color += stompSample(image, uv-texelSize*direction, texelSize) * 0.27901;
91         color += stompSample(image, uv, texelSize)                      * 0.44198;
92         color += stompSample(image, uv+texelSize*direction, texelSize) * 0.27901;
93
94         return color;
95     }
96
97     float4 sinc7(sampler2D image, float2 uv, float2 texelSize, float2
           direction) {
98         float4 color = float4(0.0, 0.0, 0.0, 0.0);
99
100        color += stompSample(image, uv-texelSize*3*direction, texelSize) *
                        0.0727;
101        color += stompSample(image, uv-texelSize*2*direction, texelSize) *
                        -0.1542;
102        color += stompSample(image, uv-texelSize*direction, texelSize)   *
                        0.2181;
103        color += stompSample(image, uv, texelSize)                       *
                        0.7268;
104        color += stompSample(image, uv+texelSize*direction, texelSize)   *
                        0.2181;
105        color += stompSample(image, uv+texelSize*2*direction, texelSize) *
                        -0.1542;
106        color += stompSample(image, uv+texelSize*3*direction, texelSize) *
                        0.0727;
107
108        return color;
109    }
110
111    float4 frag(v2f i) : COLOR
112    {
113        float rx = rand(_Time.xyz + i.uv.zyy) * 2 - 1;
114        float ry = rand(_Time.wzy + i.uv.yxx) * 2 - 1;
115        float2 roff = float2(rx, ry) * _MainTex_TexelSize.x * _Perturbation;
116        float4 col = blur5(_MainTex, i.uv + roff, _MainTex_TexelSize.xy,
                      _BlurDirection);
117
118        return col;
```

FIG. 8B

```
119                     }
120                         ENDCG
121             }
122         }
123     }
124
```

FIG. 8C

```
1   Shader "Custom/Fluid/FluidDiffusion"
2   {
3       Properties
4       {
5           _FluidVolume ("Fluid Volume", 2D) = "white" {}
6       }
7       SubShader
8       {
9           // No culling or depth
10          Cull Off ZWrite Off ZTest Always
11
12          Pass
13          {
14              CGPROGRAM
15              #pragma vertex vert
16              #pragma fragment frag
17
18              #include "UnityCG.cginc"
19              #include "Utils.cginc"
20
21              struct appdata
22              {
23                  float4 vertex : POSITION;
24                  float2 uv : TEXCOORD0;
25              };
26
27              struct v2f
28              {
29                  float2 uv : TEXCOORD0;
30                  float4 vertex : SV_POSITION;
31              };
32
33              struct FluidCell {
34                  float totalVolume;
35                  float4 ratios;
36                  bool valid;
37              };
38
39              v2f vert (appdata v)
40              {
41                  v2f o;
42                  o.vertex = UnityObjectToClipPos(v.vertex);
43                  o.uv = v.uv;
44                  return o;
45              }
46
47              sampler2D _FluidVolume;
48              float4 _FluidVolume_TexelSize;
49
50              FluidCell getCell(float2 uv, float2 offset) {
51                  const float EPSILON = 0.001;
52
53                  float4 volumes = tex2D(_FluidVolume, uv +
                    offset*_FluidVolume_TexelSize.xy);
54                  volumes.ba = float2(0, 0);
55                  float totalVolume = volumes.r + volumes.g + volumes.b + volumes.a;
56                  bool valid = totalVolume > EPSILON;
57                  float4 ratios = volumes / totalVolume;
58
59                  FluidCell self;
60                  self.valid = valid;
61                  self.totalVolume = totalVolume;
62                  self.ratios = ratios;
63                  return self;
64              }
65
66              float4 frag (v2f i) : SV_Target
67              {
68                  float2 directions[9] = {
```

FIG. 9A

```
                    float2( 0,  0),
                    float2( 0,  1),
                    float2( 1,  1),
                    float2( 1,  0),
                    float2( 1, -1),
                    float2( 0, -1),
                    float2(-1, -1),
                    float2(-1,  0),
                    float2(-1,  1)
                };

bool anyValid = false;
                float summedWeight = 0;
                float4 summedRatios = float4(0, 0, 0, 0);
                for (int j=0; j<9; j++) {
                    FluidCell cell = getCell(i.uv, directions[j]);
                    if (cell.valid) {
                        summedWeight += 1;
                        summedRatios += cell.ratios;
                        anyValid = true;
                    }
                }
                float4 averageRatios = anyValid ? summedRatios / summedWeight : float4(1,1,1,1);

FluidCell center = getCell(i.uv, float2(0, 0));
                float4 newVolumes = center.totalVolume * averageRatios;

return float4(newVolumes.rgb, 1);
            }
            ENDCG
        }
    }
}
```

FIG. 9B

```
// Upgrade NOTE: replaced 'mul(UNITY_MATRIX_MVP,*)' with 'UnityObjectToClipPos(*)'

Shader "Custom/Fluid/FluidFlow"
{
    Properties
    {
        _WorldNormal ("World Normal", 2D) = "black" {}
        _WorldTangent ("World Tangent", 2D) = "black" {}
    }
    SubShader
    {
        // No culling or depth
        Cull Off ZWrite Off ZTest Always Pass
        {
            CGPROGRAM
            #pragma vertex vert
            #pragma fragment frag include "UnityCG.cginc"
            #include "Utils.cginc"

struct appdata
            {
                float4 vertex : POSITION;
                float2 uv : TEXCOORD0;
            };

struct v2f
            {
                float2 uv : TEXCOORD0;
                float4 vertex : SV_POSITION;
            };

v2f vert (appdata v)
            {
                v2f o;
                o.vertex = UnityObjectToClipPos(v.vertex);
                o.uv = v.uv;
                return o;
            } sampler2D _WorldNormal;
            sampler2D _WorldTangent;

float4 _WorldNormal_TexelSize;

float4 frag (v2f i) : SV_Target
            {
                float2 uv = i.uv.xy;
                float3 normal  = normalize(tex2D(_WorldNormal, uv).xyz);
                float3 tangent = normalize(tex2D(_WorldTangent, uv).xyz);
                tangent = cross(tangent, normal); //Dumb correction to reorient
                tangents obtained from rt_WorldTangents
                float3 bitangent = cross(normal, tangent);

float3 gravity = float3(0, -1, 0);
                float3 flowTangent = cross(normal, gravity);
                float3 flowDirection = cross(flowTangent, normal);
                float flowStrength = dot(flowDirection, gravity);

float3x3 tangentFrame = float3x3(tangent, bitangent, normal);
                flowDirection = mul(tangentFrame, flowDirection);
                flowDirection.y *= -1;
                flowDirection.xy = lerp(flowDirection.xy, float2(0, 1), step(1-0.00001,
                    abs(dot(normal, gravity)))); //Special case: normal aligned with gravity
                flowDirection = normalize(flowDirection);
```

FIG. 10A

```
68              return float4(flowDirection.xy, flowStrength, 1);
69          }
70      ENDCG
71     }
72   }
73 }
74
```

FIG. 10B

```
// Upgrade NOTE: replaced 'mul(UNITY_MATRIX_MVP,*)' with 'UnityObjectToClipPos(*)'

Shader "Custom/Fluid/FluidSmear"
{
    Properties {}
    SubShader
    {
        // No culling or depth
        Cull Off ZWrite Off ZTest Always Pass
        {
            CGPROGRAM
            #pragma vertex vert
            #pragma fragment frag include "UnityCG.cginc"
            #include "Utils.cginc"

struct appdata
            {
                float4 vertex : POSITION;
                float2 uv : TEXCOORD0;
            };

struct v2f
            {
                float2 uv : TEXCOORD0;
                float4 vertex : SV_POSITION;
            };

v2f vert (appdata v)
            {
                v2f o;
                o.vertex = UnityObjectToClipPos(v.vertex);
                o.uv = v.uv;
                return o;
            } sampler2D _Old;
            sampler2D _New;
            sampler2D _Flow;
            float _FadeRate;
            float4 _New_TexelSize;
            float _ShiftDistance;

float4 frag (v2f i) : SV_Target
            {
                const float volumeBoost = 10;
                const float fadeRate = 0.86614173;

float2 shift = float2(0, _ShiftDistance);
                float2 oldUv = i.uv;
                float2 newUv = i.uv;
                newUv.x += sin(i.uv.y*20 + _Time.w)      * _New_TexelSize.x*0.4;
                newUv.y += sin(i.uv.y*20 + _Time.w*0.77) * _New_TexelSize.y*0.4;
                oldUv += shift;
                float4 prev = saturate(tex2D(_Old, oldUv));
                float4 curr = saturate(tex2D(_New, newUv)) * volumeBoost;

prev *= fadeRate;

float4 result = saturate(max(prev, curr));

float4 zero = float4(0, 0, 0, 0);
                float edgeProtection = _New_TexelSize.y;
                result = lerp(zero, result, step(edgeProtection, newUv.y));
                result = lerp(result, zero, step(1-edgeProtection, newUv.y));
```

FIG. 11A

```
70              return result;
71          }
72       ENDCG
73     }
74   }
75 }
76
```

FIG. 11B

```
// Upgrade NOTE: replaced 'mul(UNITY_MATRIX_MVP,*)' with 'UnityObjectToClipPos(*)'

Shader "Custom/Fluid/InitFluid"
{
    Properties {}
    SubShader
    {
        // No culling or depth
        Cull Off ZWrite Off ZTest Always Pass
        {
            CGPROGRAM
            #pragma vertex vert
            #pragma fragment frag include "UnityCG.cginc"

struct appdata
            {
                float4 vertex : POSITION;
                float2 uv : TEXCOORD0;
            };

struct v2f
            {
                float2 uv : TEXCOORD0;
                float4 vertex : SV_POSITION;
            };

v2f vert (appdata v)
            {
                v2f o;
                o.vertex = UnityObjectToClipPos(v.vertex);
                o.uv = v.uv;
                return o;
            } sampler2D _WorldPosition;
            float _TargetDepth;
            float _DisplacementVolume;
            float _ScaleFactor;
            float _CameraOffset;

float4 frag (v2f i) : SV_Target
            {
                float3 worldPosition = tex2D(_WorldPosition, i.uv).xyz - _CameraOffset;
                float fluidDepth = max(0, _TargetDepth - worldPosition.y) / _DisplacementVolume;
                float blood = lerp(0, fluidDepth, step(0, worldPosition.z));
                float water = lerp(fluidDepth, 0, step(0, worldPosition.z));
                return float4(0, fluidDepth, 0, 1);
//              return float4(blood, water, 0, 1);
            }
            ENDCG
        }
    }
}
```

FIG. 12

```
// Upgrade NOTE: replaced 'mul(UNITY_MATRIX_MVP,*)' with 'UnityObjectToClipPos(*)'

Shader "Custom/LateManipulator" {
    Properties{
        _WorldPosition("WorldPosition", 2D) = "white" {}
    }

SubShader{
    Tags{
    "RenderType" = "Transparent"
    "IgnoreProjector" = "True"
    "Queue" = "Transparent+10"
    }

Pass{
    Name "FORWARD"
    Tags{
    "LightMode" = "ForwardBase"
    }
    Blend One Zero
    ZWrite Off CGPROGRAM
pragma vertex vert
pragma fragment frag include "UnityCG.cginc"

const static int MAX_MANIPULATORS = 64;

sampler2D _WorldPosition;
    sampler2D _PreviousManipulators;
    float _ScaleFactor;

int _ManipulatorCount;
    float4 _CameraOffset;

cbuffer LateManipulatorBuffer
    {
        const float4 _LateAnchorPositions[MAX_MANIPULATORS];
        const float4 _LateHandlePositions[MAX_MANIPULATORS];
        const float4x4 _LateHandleTransforms[MAX_MANIPULATORS];
        const float _LateFalloffRadii[MAX_MANIPULATORS];
        const float _LatePowers[MAX_MANIPULATORS];
    } struct VertexInput
    {
        float4 vertex : POSITION;
        float2 texcoord0 : TEXCOORD0;
    };

struct VertexOutput
    {
        float4 pos : SV_POSITION;
        float2 uv : TEXCOORD0;
    };

float bias(float x, float bias) {
        return x / ((1 / bias - 2) * (1 - x) + 1);
    } float unlerp(float edge0, float edge1, float x) {
        return saturate((x - edge0) / (edge1 - edge0));
    } bool anybad(float3 test) {
        return
            isnan(test.x) || isinf(test.x) ||
```

FIG. 13A

```
                isnan(test.y) || isinf(test.y) ||
                isnan(test.z) || isinf(test.z);
        } bool anybad(float test) {
            return isnan(test) || isinf(test);
        } float smootherstep(float edge0, float edge1, float x) {
            x = clamp((x - edge0) / (edge1 - edge0), 0.0, 1.0);
            return x*x*x*(x*(x * 6 - 15) + 10);
        } float distanceToLine(float3 a, float3 b, float3 p) {
            return length(cross(b - a, a - p)) / (length(b - a) + 0.000001);
        }

// returns accumulated weight and updates the weighted average vector
        float3 applyManipulator(
            float4x4 handleTransform,
            float4 handlePosition,
            float4 anchorPosition,
            float falloffRadius,
            float4 vPosition
        ) {
            const float nanSafety = 0.00000001; //Horrible hack
            const float graspRadius = 0;

float4 offsetPosition = mul(handleTransform, vPosition);
            float maxRadius = falloffRadius + graspRadius;
            float distanceFromAnchor = length(vPosition.xyz - anchorPosition) / maxRadius;
            float power = smootherstep(graspRadius, maxRadius, distanceFromAnchor);

power = max(power, nanSafety);
            offsetPosition.xyz = lerp(offsetPosition, vPosition, power);

return offsetPosition.xyz - vPosition.xyz;
        }

VertexOutput vert(VertexInput v) {
            VertexOutput o = (VertexOutput)0;
            o.uv = v.texcoord0;
            o.pos = UnityObjectToClipPos(v.vertex);
            return o;
        } float4 frag(VertexOutput vin) : COLOR{
            float4 rawVPosition = tex2D(_WorldPosition, vin.uv.xy);
            float4 earlyOffset = tex2D(_PreviousManipulators, vin.uv.xy);
            float4 vPosition = rawVPosition * _ScaleFactor + earlyOffset + _CameraOffset;
            float3 runningOffset = float3(0, 0, 0);
            float weight = 0;

for (int i = 0; i < _ManipulatorCount; i++) {
                float3 v = applyManipulator(
                    _LateHandleTransforms[i],
                    _LateHandlePositions[i],
                    _LateAnchorPositions[i],
                    _LateFalloffRadii[i],
                    vPosition);
                float w = length(v) * _LatePowers[i];

runningOffset = v * w + runningOffset;
                weight += w;
            } float3 lateOffset = runningOffset / max(weight, .01);
            float3 final = earlyOffset + lateOffset;
```

FIG. 13B

```
139         return float4(final.x, final.y, final.z, 1);
140       }
141     ENDCG
142     }
143   }
144 }
```

FIG. 13C

```csharp
using UnityEngine;
using System;
using System.Collections;
using System.Collections.Generic;

public class ManipulatorManager : MonoBehaviour
{
    const int MAX_MANIPULATORS = 32; //MAX_MANIPULATORS in RTManipulator.shader must have same value
    const int MAX_LINE_MANIPULATORS = 32; //MAX_LINE_MANIPULATORS in RTManipulator.shader must have same value

[Range(1, 50)]
    public int RelaxationIterations = 20;

public Shader pinnedManipulatorShader;
    public Shader lateManipulatorShader;
    public Shader meshRelaxationKernelShader;
    public Shader meshRelaxationUpdateShader;
    public Shader combineTexturesShader;

private Material _pinnedManipulatorMaterial;
    private Material _lateManipulatorMaterial;
    private Material _relaxationKernelMaterial;
    private Material _relaxationUpdateMaterial;
    private Material _combineTexturesMaterial;

private RenderTexture RT_Manipulator;
    private RenderTexture RT_WorldPositions_PostManipulator;
    private RenderTexture RT_Manipulator_Pinned;
    private RenderTexture _downsampledBasePositions;
    private RenderTexture sourceRT, targetRT, tmpRtSwap;

private List<Manipulator> manipulators = new List<Manipulator>();
    private List<Manipulator> lateManipulators = new List<Manipulator>();
    private List<LineManipulator> lineManipulators = new List<LineManipulator>();

private Vector4[] anchorPositions = new Vector4[MAX_MANIPULATORS];
    private Vector4[] handlePositions = new Vector4[MAX_MANIPULATORS];
    private Matrix4x4[] transforms = new Matrix4x4[MAX_MANIPULATORS];
    private float[] falloffRadii = new float[MAX_MANIPULATORS];
    private float[] powers = new float[MAX_MANIPULATORS];

private Vector4[] lineStarts = new Vector4[MAX_LINE_MANIPULATORS];
    private Vector4[] lineEnds = new Vector4[MAX_LINE_MANIPULATORS];
    private float[] lineRadii = new float[MAX_LINE_MANIPULATORS];

[System.NonSerialized]
    public bool initializationRequested = false;

void Start()
    {
        RT_Manipulator_Pinned =
        LevelGameObjects.instance.renderTextureManager.RT_Manipulator_Pinned;
        RT_Manipulator = LevelGameObjects.instance.renderTextureManager.RT_Manipulator;
        RT_WorldPositions_PostManipulator =
        LevelGameObjects.instance.renderTextureManager.RT_WorldPosition_PostManipulator;

_pinnedManipulatorMaterial = new Material(pinnedManipulatorShader);
        _lateManipulatorMaterial = new Material(lateManipulatorShader);
        _relaxationKernelMaterial = new Material(meshRelaxationKernelShader);
        _relaxationUpdateMaterial = new Material(meshRelaxationUpdateShader);
        _combineTexturesMaterial = new Material(combineTexturesShader);

GameManager.instance.qualityManager.qualityChangedEvent += QualityChanged;
    } void OnDestroy()
    {
```

FIG. 14A

```
66              GameManager.instance.qualityManager.qualityChangedEvent -= QualityChanged;
67          }
68
69          public void QualityChanged(QualityManager.GraphicsSettings settings)
70          {
71              if (GameManager.instance.qualityManager.useVerboseLogging)
72                  Debug.Log("Updating graphics settings: Manipulator");
73
74              RelaxationIterations = settings.manipulatorIterations;
75              SetUpRenderTextures(settings.manipulatorResolution);
76              initializationRequested = true;
77          }
78
79          void SetUpRenderTextures(int resolution)
80          {
81              if (_downsampledBasePositions == null)
82              {
83                  _downsampledBasePositions = new RenderTexture(resolution, resolution, 0,
                        RenderTextureFormat.ARGBHalf);
84                  _downsampledBasePositions.filterMode = FilterMode.Point;
85                  _downsampledBasePositions.wrapMode = TextureWrapMode.Repeat;
86                  _downsampledBasePositions.Create();
87              }
88              else if (resolution != _downsampledBasePositions.width)
89              {
90                  _downsampledBasePositions.Release();
91                  _downsampledBasePositions.width = resolution;
92                  _downsampledBasePositions.height = resolution;
93                  _downsampledBasePositions.Create();
94              }
95
96              if (sourceRT == null)
97              {
98                  sourceRT = new RenderTexture(resolution, resolution, 0,
                        RenderTextureFormat.ARGBHalf);
99                  sourceRT.filterMode = FilterMode.Bilinear;
100                 sourceRT.wrapMode = TextureWrapMode.Repeat;
101                 sourceRT.Create();
102             }
103             else if (resolution != sourceRT.width)
104             {
105                 sourceRT.Release();
106                 sourceRT.width = resolution;
107                 sourceRT.height = resolution;
108                 sourceRT.Create();
109             }
110
111             if (targetRT == null)
112             {
113                 targetRT = new RenderTexture(resolution, resolution, 0,
                        RenderTextureFormat.ARGBHalf);
114                 targetRT.filterMode = FilterMode.Bilinear;
115                 targetRT.wrapMode = TextureWrapMode.Repeat;
116                 targetRT.Create();
117             }
118             else if (resolution != targetRT.width)
119             {
120                 targetRT.Release();
121                 targetRT.width = resolution;
122                 targetRT.height = resolution;
123                 targetRT.Create();
124             }
125
126             initializationRequested = true;
127         }
128
129         public void AddManipulator(Manipulator m)
130         {
131             if (m.late)
```

FIG. 14B

```
            lateManipulators.Add(m);
        else
            manipulators.Add(m);
    } public void RemoveManipulator(Manipulator m)
    {
        manipulators.Remove(m);
        lateManipulators.Remove(m);
    } public void AddLineManipulator(LineManipulator m)
    {
        lineManipulators.Add(m);
    } public void RemoveLineManipulator(LineManipulator m)
    {
        lineManipulators.Remove(m);
    } public void Render()
    {
        if (GameManager.instance.qualityManager.currentGraphicsSettings.enableManipulator)
        {
            if (initializationRequested)
            {
                Clear();
                initializationRequested = false;
            }

UpdatePinnedManipulators();
            RelaxManipulators();
            UpdateLateManipulators();
        }
        else
        {
            Clear();
        }
    } private void WritePostManipulatorTexture()
    {
        _combineTexturesMaterial.SetTexture("_WorldPositionPreManipulator",
            LevelGameObjects.instance.renderTextureManager.RT_WorldPosition_PreManipulator);
        _combineTexturesMaterial.SetTexture("_Manipulator", sourceRT);

Graphics.Blit(null, RT_WorldPositions_PostManipulator, _combineTexturesMaterial);
    } private void UpdateLateManipulators()
    {
        LoadArraysFromManipulators(lateManipulators);

_lateManipulatorMaterial.SetInt("_ManipulatorCount", lateManipulators.Count);
        _lateManipulatorMaterial.SetVectorArray("_LateAnchorPositions", anchorPositions);
        _lateManipulatorMaterial.SetVectorArray("_LateHandlePositions", handlePositions);
        _lateManipulatorMaterial.SetMatrixArray("_LateHandleTransforms", transforms);
        _lateManipulatorMaterial.SetFloatArray("_LateFalloffRadii", falloffRadii);
        _lateManipulatorMaterial.SetFloatArray("_LatePowers", powers);

_lateManipulatorMaterial.SetTexture("_WorldPosition",
            LevelGameObjects.instance.renderTextureManager.RT_WorldPosition_PreManipulator);
        _lateManipulatorMaterial.SetTexture("_PreviousManipulators", sourceRT);

// Write directly to RT_Manipulator so it gets put back into the mesh, but skip
        // writing to sourceRT since we don't want late manipulators
        // to feed back into the next pass of pinned manipulators & relaxation
        Graphics.Blit(null, RT_Manipulator, _lateManipulatorMaterial);
```

FIG. 14C

```
198     }
199
200     private void UpdatePinnedManipulators()
201     {
202         LoadArraysFromManipulators(manipulators);
203         LoadArraysFromLineManipulators(lineManipulators);
204
205         _pinnedManipulatorMaterial.SetInt("_ManipulatorCount", manipulators.Count);
206         _pinnedManipulatorMaterial.SetVectorArray("_AnchorPositions", anchorPositions);
207         _pinnedManipulatorMaterial.SetVectorArray("_HandlePositions", handlePositions);
208         _pinnedManipulatorMaterial.SetMatrixArray("_HandleTransforms", transforms);
209         _pinnedManipulatorMaterial.SetFloatArray("_FalloffRadii", falloffRadii);
210         _pinnedManipulatorMaterial.SetFloatArray("_Powers", powers);
211
212         _pinnedManipulatorMaterial.SetVectorArray("_LineStarts", lineStarts);
213         _pinnedManipulatorMaterial.SetVectorArray("_LineEnds", lineEnds);
214         _pinnedManipulatorMaterial.SetFloatArray("_LineRadii", lineRadii);
215         _pinnedManipulatorMaterial.SetVectorArray("_SplinePositions",
216         LevelGameObjects.instance.splineManager.segmentPositions);
217
        _pinnedManipulatorMaterial.SetTexture("_WorldPosition",
        LevelGameObjects.instance.renderTextureManager.RT_WorldPosition_PreManipulator);
218
219     Graphics.Blit(null, RT_Manipulator_Pinned, _pinnedManipulatorMaterial);
220     }
221
222     private void RelaxManipulators()
223     {
224
        Graphics.Blit(LevelGameObjects.instance.renderTextureManager.RT_WorldPosition_PreMa
        nipulator, _downsampledBasePositions);
225
226         _relaxationUpdateMaterial.SetTexture("_BaseWorldPosition",
            _downsampledBasePositions);
227         _relaxationUpdateMaterial.SetTexture("_PinnedManipulator", RT_Manipulator_Pinned);
228         _relaxationUpdateMaterial.SetTexture("_CurrentPosition", sourceRT);
229         Graphics.Blit(null, targetRT, _relaxationUpdateMaterial);
230         SwapRelaxationRts();
231
232         for (int i = 0; i < RelaxationIterations; i++)
233         {
234             _relaxationKernelMaterial.SetTexture("_Displacements", sourceRT);
235             Graphics.Blit(null, targetRT, _relaxationKernelMaterial);
236             SwapRelaxationRts();
237         }
238     }
239
240     private void SwapRelaxationRts()
241     {
242         tmpRtSwap = sourceRT;
243         sourceRT = targetRT;
244         targetRT = tmpRtSwap;
245     }
246
247     private void Clear()
248     {
249         RenderTexture.active = sourceRT;
250         GL.Clear(false, true, Color.black);
251         RenderTexture.active = targetRT;
252         GL.Clear(false, true, Color.black);
253         RenderTexture.active = RT_Manipulator;
254         GL.Clear(false, true, Color.black);
255     }
256
257     private void LoadArraysFromManipulators(List<Manipulator> ms)
258     {
259         for (int i = 0; i < MAX_MANIPULATORS; i++)
260         {
261             if (i < ms.Count)
```

FIG. 14D

```
            {
                Manipulator manip = ms[i];

anchorPositions[i] = manip.AnchorPosition();
                handlePositions[i] = manip.HandlePosition();
                transforms[i] = manip.HandleTransform();
                falloffRadii[i] = manip.falloffRadius;
                powers[i] = manip.power;
            }
            else
            {
                anchorPositions[i] = Vector4.zero;
                handlePositions[i] = Vector4.zero;
                transforms[i] = Matrix4x4.identity;
                falloffRadii[i] = 0.00001f;
                powers[i] = 0;
            }
        }
    } private void LoadArraysFromLineManipulators(List<LineManipulator> ms)
    {
        for (int i = 0; i < MAX_LINE_MANIPULATORS; i++)
        {
            if (i < ms.Count)
            {
                LineManipulator manip = ms[i];

lineStarts[i] = manip.Start.position;
                lineEnds[i] = manip.End.position;
                lineRadii[i] = manip.Radius;
            }
            else
            {
                lineStarts[i] = Vector4.zero;
                lineEnds[i] = Vector4.zero;
                lineRadii[i] = 0;
            }
        }
    }
}
```

FIG. 14E

```
// Upgrade NOTE: replaced 'mul(UNITY_MATRIX_MVP,*)' with 'UnityObjectToClipPos(*)'

Shader "Custom/Mesh Relaxation Kernel"
{
    Properties {
        _Displacements("Displacements", 2D) = "black" {}
    }

SubShader {
        // No culling or depth
        Cull Off ZWrite Off ZTest Always Pass {
            CGPROGRAM
            #pragma vertex vert
            #pragma fragment frag include "UnityCG.cginc"
            #include "Utils.cginc"

struct appdata {
                float4 vertex : POSITION;
                float2 uv : TEXCOORD0;
            };

struct v2f {
                float2 uv : TEXCOORD0;
                float4 vertex : SV_POSITION;
            };

v2f vert(appdata v) {
                v2f o;
                o.vertex = UnityObjectToClipPos(v.vertex);
                o.uv = v.uv;
                return o;
            } sampler2D _Displacements;
            float4 _Displacements_TexelSize;

float _PassIndex;
            float2 _BlurDirection;

float _ScaleFactor;
            float4 _CameraOffset;

const float EPS = 0.0001;

float4 getDisplacement(float2 uv, float2 texelOffset) {
                float4 disp = tex2D(_Displacements, uv +
                texelOffset*_Displacements_TexelSize.xy);

float4 zero = float4(0,0,0,0);
                float edgeProtection = _Displacements_TexelSize.y;
                disp = lerp(zero, disp, step(edgeProtection, uv.y));
                disp = lerp(disp, zero, step(1-edgeProtection, uv.y));

return disp;
            } float getWeight(float3 disp, float stiffness) {
                return lerp(1, pow(max(length(disp), 0.0001), 3), stiffness);
            } float3 getNeighborDisplacement(float2 uv, float stiffness) {
                const float patchSize = 1;
                float3 neighborN  = getDisplacement(uv, float2(0, patchSize));
                float3 neighborNE = getDisplacement(uv, float2(patchSize, patchSize));
                float3 neighborE  = getDisplacement(uv, float2(patchSize, 0));
```

FIG. 15A

```
        float3 neighborSE = getDisplacement(uv, float2(patchSize, -patchSize));
        float3 neighborS  = getDisplacement(uv, float2(0, -patchSize));
        float3 neighborSW = getDisplacement(uv, float2(-patchSize, -patchSize));
        float3 neighborW  = getDisplacement(uv, float2(-patchSize, 0));
        float3 neighborNW = getDisplacement(uv, float2(-patchSize, patchSize));

float weightN  = getWeight(neighborN,  stiffness);
        float weightNE = getWeight(neighborNE, stiffness);
        float weightE  = getWeight(neighborE,  stiffness);
        float weightSE = getWeight(neighborSE, stiffness);
        float weightS  = getWeight(neighborS,  stiffness);
        float weightSW = getWeight(neighborSW, stiffness);
        float weightW  = getWeight(neighborW,  stiffness);
        float weightNW = getWeight(neighborNW, stiffness);

float totalWeight = weightN + weightNE + weightE + weightSE + weightS +
        weightSW + weightW + weightNW;
        totalWeight = max(totalWeight, 0.0001);

return (
            neighborN  * weightN  +
            neighborNE * weightNE +
            neighborE  * weightE  +
            neighborSE * weightSE +
            neighborS  * weightS  +
            neighborSW * weightSW +
            neighborW  * weightW  +
            neighborNW * weightNW) / totalWeight;
    } float4 frag(v2f i) : SV_Target {
        float4 center = tex2D(_Displacements, i.uv);

float stiffness = 0;

float3 neighborDisplacement = getNeighborDisplacement(i.uv, stiffness);
        float3 pinnedDisplacement = pickLongest(neighborDisplacement,
        center.xyz);

float3 finalDisplacement = lerp(neighborDisplacement,
        pinnedDisplacement, center.a); //No displacement if pinned return float4(finalDisplacement, center.a);
    }
    ENDCG
  }
 }
}
```

FIG. 15B

```
// Upgrade NOTE: replaced 'mul(UNITY_MATRIX_MVP,*)' with 'UnityObjectToClipPos(*)'

Shader "Custom/Mesh Relaxation Update"
{
    Properties {
        _BaseWorldPosition("Base World Position", 2D) = "white" {}
        _PinnedManipulator("Pinned Manipulator", 2D) = "white" {}
        _CurrentPosition("Current Position", 2D) = "white" {}
    }

SubShader {
        // No culling or depth
        Cull Off ZWrite Off ZTest Always Pass {
            CGPROGRAM
            #pragma vertex vert
            #pragma fragment frag include "UnityCG.cginc"
            #include "Utils.cginc"

struct appdata {
                float4 vertex : POSITION;
                float2 uv : TEXCOORD0;
            };

struct v2f {
                float2 uv : TEXCOORD0;
                float4 vertex : SV_POSITION;
            };

struct VertexInfo {
                float3 basePosition;
                float3 currentPosition;
                float3 manipulatorOffset;
                float3 effectivePosition;
                float3 displacement;
                float pinned;
            };

v2f vert(appdata v) {
                v2f o;
                o.vertex = UnityObjectToClipPos(v.vertex);
                o.uv = v.uv;
                return o;
            } sampler2D _BaseWorldPosition;
            sampler2D _PinnedManipulator;
            sampler2D _CurrentPosition;
            float4 _BaseWorldPosition_TexelSize;
            float4 _PinnedManipulator_TexelSize;
            float4 _CurrentPosition_TexelSize;

float _ShiftDistance;

float _ScaleFactor;
            float4 _CameraOffset;

const float EPS = 0.0001;

float2 saturateV(float2 input) {
                return float2(input.x, saturate(input.y));
            }

VertexInfo getVertexInfo(float2 uv, float2 pixelOffset) {
                float2 shift = float2(0, _ShiftDistance);
                VertexInfo info;
```

FIG. 16A

```
        info.basePosition     = tex2D(_BaseWorldPosition, uv + shift +
            pixelOffset*_BaseWorldPosition_TexelSize.xy).xyz;
        info.currentPosition  = tex2D(_CurrentPosition,   uv + shift +
            pixelOffset*_CurrentPosition_TexelSize.xy).xyz + info.basePosition;
        info.manipulatorOffset = tex2D(_PinnedManipulator, uv + shift +
            pixelOffset*_PinnedManipulator_TexelSize.xy).xyz;

info.pinned = 1 - step(EPS, -length(info.manipulatorOffset));

info.effectivePosition = lerp(info.currentPosition, info.basePosition +
            info.manipulatorOffset, info.pinned);

info.displacement = info.effectivePosition - info.basePosition;

return info;
    } float4 frag(v2f i) : SV_Target{
        VertexInfo center = getVertexInfo(i.uv, float2(0, 0));

float restitutionStrength = 0.008661417;
        float3 towardZero = -center.displacement;
        float distanceFromZero = length(towardZero + 0.00001);
        float3 restorativeDisplacement = center.displacement +
            normalize(towardZero + 0.00001) * min(distanceFromZero,
            restitutionStrength); //Restitution
        float3 displacement = lerp(restorativeDisplacement,
            center.displacement, center.pinned);

return float4(displacement, center.pinned);
    }
ENDCG
    }
}
```

FIG. 16B

```
// Upgrade NOTE: replaced 'mul(UNITY_MATRIX_MVP,*)' with 'UnityObjectToClipPos(*)'

Shader "Custom/Pinned Manipulator" {
    Properties{
        _WorldPosition("WorldPosition", 2D) = "white" {}
    }

SubShader{
        Cull Off ZWrite Off ZTest Always
            Pass{
                CGPROGRAM
                #define PI 3.14159265359
                #pragma vertex vert
                #pragma fragment frag include "UnityCG.cginc"
                #include "SDF.cginc"
                #include "Utils.cginc"

const static int MAX_MANIPULATORS = 32;
                const static int MAX_LINE_MANIPULATORS = 32;

sampler2D _WorldPosition;
                float _ShiftDistance;
                float _ScaleFactor;
                float4 _CameraOffset;
                float _RunningUvOffset;

const static int _maxArrayCount = 512;
                cbuffer splinedata_positions
                {
                    const float4 _splinePositions[_maxArrayCount];
                } cbuffer ManipulatorBuffer
                {
                    const float4 _AnchorPositions[MAX_MANIPULATORS];
                    const float4 _HandlePositions[MAX_MANIPULATORS];
                    const float4x4 _HandleTransforms[MAX_MANIPULATORS];
                    const float _FalloffRadii[MAX_MANIPULATORS];
                    const float _Powers[MAX_MANIPULATORS];
                } cbuffer LateManipulatorBuffer
                {
                    const float4 _LateAnchorPositions[MAX_MANIPULATORS];
                    const float4 _LateHandlePositions[MAX_MANIPULATORS];
                    const float4x4 _LateHandleTransforms[MAX_MANIPULATORS];
                    const float _LateFalloffRadii[MAX_MANIPULATORS];
                    const float _LatePowers[MAX_MANIPULATORS];
                } cbuffer LineManipulatorBuffer
                {
                    const float4 _LineStarts[MAX_LINE_MANIPULATORS];
                    const float4 _LineEnds[MAX_LINE_MANIPULATORS];
                    const float _LineRadii[MAX_LINE_MANIPULATORS];
                } struct VertexInput
                {
                    float4 vertex : POSITION;
                    float2 texcoord0 : TEXCOORD0;
                };

struct VertexOutput
                {
                    float4 pos : SV_POSITION;
                    float2 uv : TEXCOORD0;
```

FIG. 17A

```
70      };
71
72      VertexOutput vert(VertexInput v) {
73          VertexOutput o = (VertexOutput)0;
74          o.uv = v.texcoord0;
75          o.pos = UnityObjectToClipPos(v.vertex);
76          return o;
77      }
78
79      float3 pickWeightedLongest(float3 a, float3 b, float weight) {
80          return lerp(a, b, step(length(a), length(b) * weight));
81      }
82
83      float3 getManipulatorOffset(float4 vPosition, float4x4 handleTransform,
        float4 anchorPosition, float falloffRadius) {
84          float4 offsetPosition = mul(handleTransform, vPosition);
85          float3 relativeOffset = offsetPosition.xyz - vPosition.xyz;
86          float distanceFromAnchor = length(vPosition.xyz - anchorPosition.xyz);
87          float isAffected = step(distanceFromAnchor, falloffRadius);
88          return relativeOffset * isAffected;
89      }
90
91      float distanceField(float3 position, float3 vPosition) {
92          float distance = 100000;
93          for (int i = 0; i < MAX_LINE_MANIPULATORS; i++) {
94              distance = min(distance, fCapsule(position, _LineStarts[i],
                _LineEnds[i], _LineRadii[i]));
95          }
96          return distance;
97      }
98
99
100     float3 applyLineManipulator(float2 uv, float4 vPosition) {
101         float RAYMARCH_EPSILON = 0.001;
102         float MAX_RAYMARCH_DISTANCE = 5;
103         int MAX_RAYMARCH_ITERATIONS = 25;
104
105         int index = clamp(floor(uv.y * _maxArrayCount), 0, _maxArrayCount-1);
106         float3 splineCenter = _splinePositions[index].xyz;
107         float3 outwards = normalize(vPosition.xyz - splineCenter);
108         float3 raymarchOrigin = splineCenter + outwards * MAX_RAYMARCH_DISTANCE;
109
110
111         //Sphere trace distance field
112         float3 marchFrom = raymarchOrigin;
113         float3 marchPosition = marchFrom;
114         float3 marchDirection = outwards * -1;
115
116         float totalDist = 0.0;
117         float dist = RAYMARCH_EPSILON;
118         float prevDist = dist;
119         float closestDist = dist;
120         float3 closestPoint = vPosition.xyz;
121         float3 result = vPosition.xyz;
122
123         for (int i = 0; i < MAX_RAYMARCH_ITERATIONS; i++)
124         {
125             if (dist < RAYMARCH_EPSILON) {
126                 //Hit
127                 result = marchPosition;
128             }
129             else if (totalDist > MAX_RAYMARCH_DISTANCE) {
130                 //Missed
131                 result = vPosition;
132             }
133             else {
134                 dist = distanceField(marchPosition, vPosition.xyz);
135
136                 totalDist += dist;
```

FIG. 17B

```
                    marchPosition += dist * marchDirection;

closestPoint = dist < prevDist ? marchPosition : closestPoint;
                    closestDist = min(dist, closestDist);
                    prevDist = dist;
                }
            } result = length(splineCenter - result) > length(splineCenter -
            vPosition) ? result : vPosition;
            result -= vPosition.xyz;

return result.xyz;
        } float4 frag(VertexOutput vin) : COLOR {
            float2 uv = vin.uv.xy - float2(0, _ShiftDistance);
            float4 rawVPosition = tex2D(_WorldPosition, uv);
            float4 vPosition = rawVPosition * _ScaleFactor + _CameraOffset;
            float3 runningOffset = float3(0, 0, 0);
            float weight = 0;

for (int i = 0; i < MAX_MANIPULATORS; i++) {
                float3 offset = getManipulatorOffset(vPosition,
                _HandleTransforms[i], _AnchorPositions[i], _FalloffRadii[i]);
                runningOffset = pickWeightedLongest(runningOffset, offset,
                _Powers[i]);
            } runningOffset = pickLongest(runningOffset, applyLineManipulator(uv,
            vPosition));

float3 final = runningOffset;

//Level consists of 14 tiles, so if uv.y + _RunningUvOffset we've
            reached the end of the colon.
            //The cecum's shape causes problems with SDFs, so disable pinning
            within a small UV distance
            //from the end of the level:
            const float stompDistance = 14.0 - 0.22834646;
            float stomp = 1-step(stompDistance, (uv.y + _RunningUvOffset));
            final *= stomp;

float pinned = any(final);
            return float4(final.x, final.y, final.z, pinned);
        }
        ENDCG
    }
}
```

FIG. 17C

METHODS AND SYSTEMS FOR SIMULATING FLUID MOVEMENT

CROSS-REFERENCE TO RELATED APPLICATIONS

This application is a continuation of U.S. application Ser. No. 16/169,990 filed Oct. 24, 2018. The entire contents of this application is incorporated herein by reference in its entirety.

BRIEF DESCRIPTION OF THE FIGURES

FIGS. 5A-5B, 6A-6E, 7A-7C, 8A-8C, 9A-9B, 10A-10B, 11A-11B, and 12 illustrate various source code utilized in fluid simulation, according to an embodiment.

FIGS. 13A-13C, 14A-14E, 15A-15B, 16A-16B, and 17A-17C illustrate various source code utilized in softbody tissue simulation, according to an embodiment.

DESCRIPTION OF EMBODIMENTS

Mesh topology can comprise a local network topology where the infrastructure nodes (e.g., bridges, switches, etc.) connect directly, dynamically, and/or non-hierarchically to many other nodes and cooperate with one another to efficiently route data to and/or from clients. UV mapping can comprise a 3D modeling process where a 2D image is projected to a 3D model's surface for texture mapping. (The letters "U" and "V" can denote the axes of the 2D texture because "X", "Y" and "Z" are already used to denote the axes of the 3D object in model space.) Mesh topology can be trivially UV-mapped to a plane without UV islands. (UV islands can comprise a connected group of polygons (e.g., a collection of vertices, edges and faces that define the shape of an object in 3D computer graphics).)

Mapping mesh topology to a plane without UV islands can require that the geometry be topologically planar, cylindrical, or toroidal. Vertex positions can be stored in a 2D texture. A vertex can be a data structure that describes certain attributes, like the position of a point in 2D or 3D space at multiple points on a surface. Texture mapping can define high frequency detail, surface texture, and/or color information. When rendering geometry, a vertex shader (e.g., which can be used for a variety of special effects) can use the UV coordinates of each vertex to sample its position from the position texture. A vertex shader can transform each vertex's 3D position in virtual space to the 2D coordinate at which it appears on the screen. Vertex shaders can manipulate properties such as position, movement, lighting, color and/or texture coordinates. Fluid and softbody systems can thus be implemented as a series of fragment shaders (that can process a fragment generated by rasterization into a set of colors and a single depth value) that store intermediate results in frame buffers. In some embodiments, the processes described below can be performed in parallel for each texel, implemented in fragment shaders.

In some embodiments, the fluid simulation and/or softbody simulation can be utilized in video games. For example, games for medical professionals can utilize the embodiments described herein to help sharpen cognitive and analytical skills applied at the point-of-care. Actual patient cases can be created, as mobile, VR, and AR experiences, with realism and interactivity. Medical professionals can be introduced and trained on new techniques, the latest medical devices and drug therapies in a risk-free environment. The simulations can be available for iOS and Android.

Fluids

Figure 1:
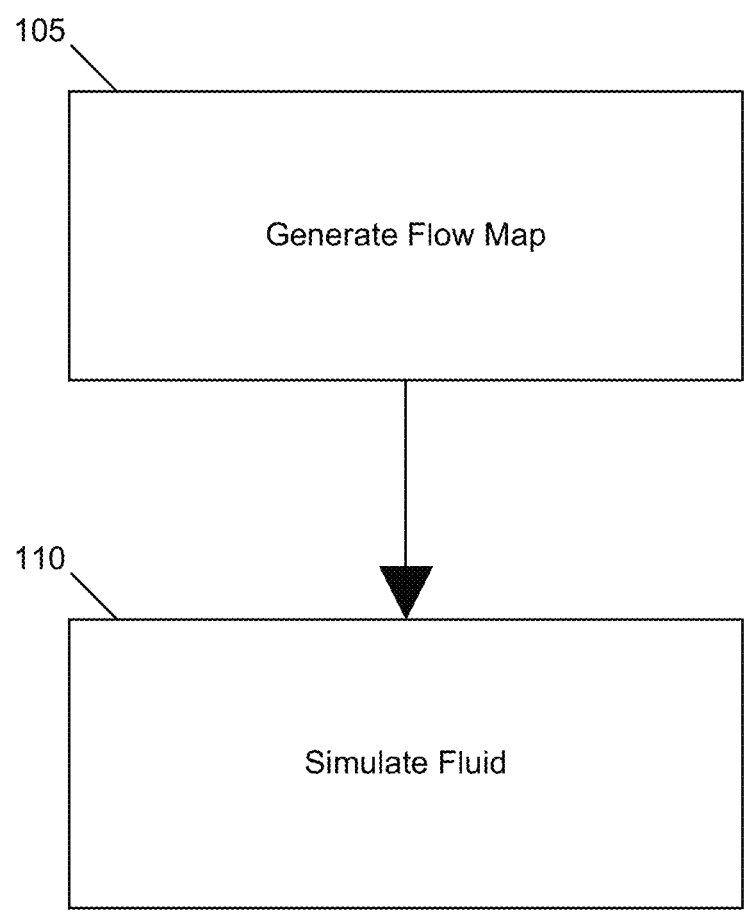
FIG. 1 illustrates a method for determining fluid simulation, according to an embodiment.

FIG. 1 illustrates a method for determining fluid simulation, according to an embodiment. In 105, a flow map can be generated. In 110, the fluid can be simulated.

Generating the Flow Map.

Figure 2:
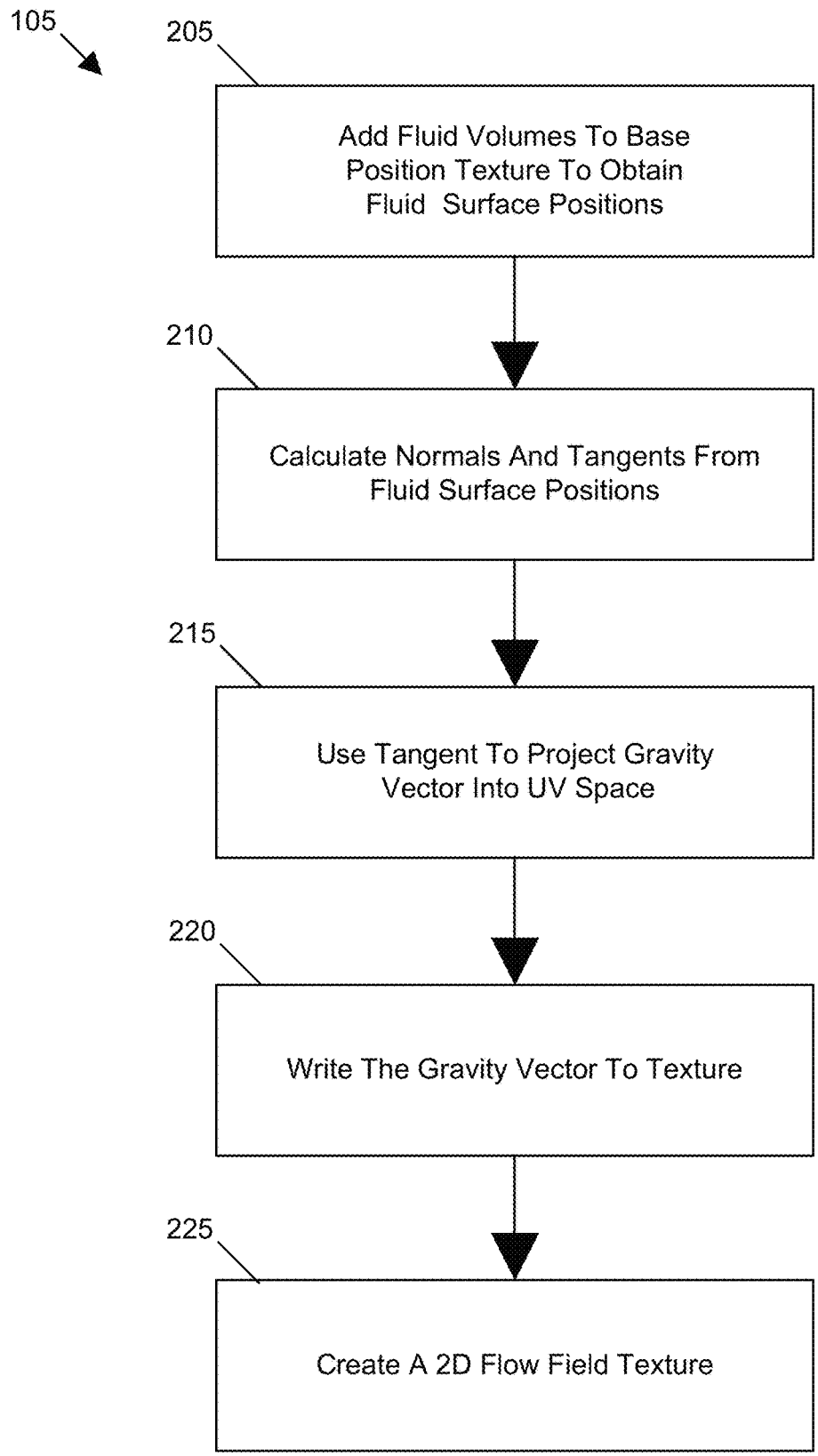
FIG. 2 illustrates details of generating a flow map, according to an embodiment.

FIG. 2 illustrates details of generating the flow map (105), according to an embodiment. In 205, fluid volumes can be added to a base position texture in order to obtain fluid surface positions. In 210, normals and tangents can be calculated from the fluid surface positions. In 215, a tangent can be used to project a gravity vector into UV space. In 220, the gravity vector can be written to a texture. In 225, a 2D flow field texture can result, showing the directions that the fluid must move in order to flow downhill.

Simulating the Fluid.

Figure 3:
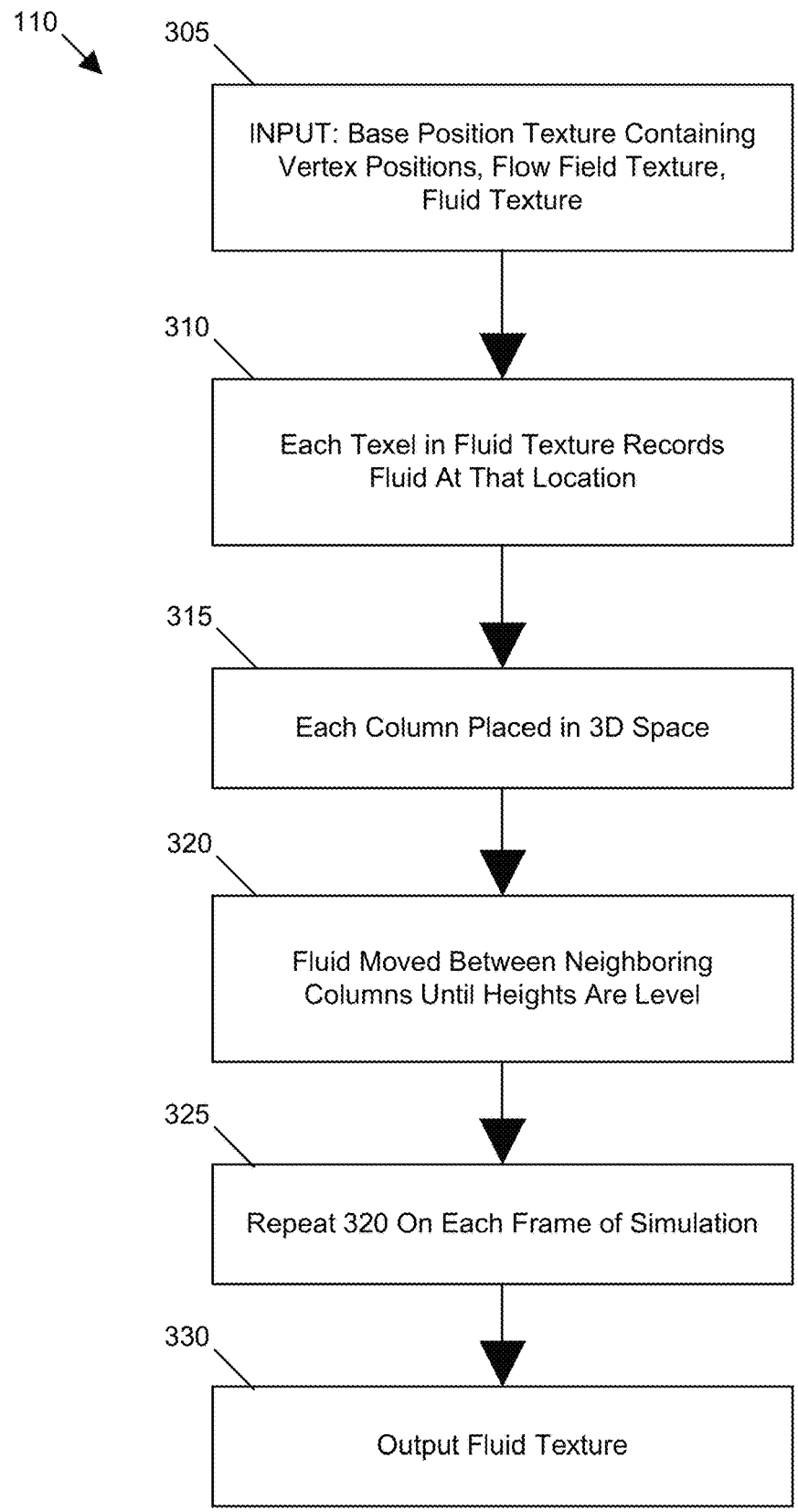
FIG. 3 illustrates details of the fluid simulation, according to an embodiment.

FIG. 3 illustrates details of simulating the fluid (110), according to an embodiment. In 305, the following can be input into the algorithm: base position texture containing base vertex positions, flow field texture, and/or fluid texture containing fluid volume. In 310, each texel in the fluid texture can record the amount of fluid at that location. (A texel can be thought of as a vertical column of fluid. The height of the vertical column of fluid can be used to determine the texel value.) In 315, each column can be placed in 3D space atop the underlying geometry, sampled from the position texture. In 320, fluid can be moved between neighboring vertical columns of fluid until their heights (e.g., tops) are level in 3D space. For example, fluid can flow from a column into one of its 8 immediate neighbors. In 325, process 320 can be repeated on each frame of the simulation, and the fluid can form still pools. In 330, the output can be the fluid texture containing the fluid volume.

Sample Algorithm.

In some embodiments, the following algorithm can be used:

A. Determine 3D location of the fluid's surface:
   Sample the base vertex position
   Sample the fluid volume, multiply by column-height scalar
   Negate the gravity-direction vector, multiply it by the column height, and add the resulting vector to the base position B. Calculate "outflow," (e.g., how much fluid must leave the current column):
   From the 8 neighboring texels, select the most "downhill" neighbor. This is explained in more detail in the Neighbor Selection section below.
   Calculate the amount of fluid that would need to flow into the chosen neighbor in order for the two columns to be level. This is equal to either one-half the difference in height between the two 3D surface positions (e.g., divided by the height scalar, which in our case is 1), or all of the remaining fluid in the texel, whichever is smaller.

C. Calculate "inflow," (e.g., the amount of fluid flowing into the current column from its neighbors)

For each of the 8 neighbors, calculate their outflow values using the above outflow calculation.

If the neighbor's outflow calculation chose the current texel as its outflow target, add its outflow volume to the inflow running total.

Inflow is thus the sum of all volume that flowed into the texel from its neighbors.

D. Calculate the new fluid volume and write it back to the fluid texture

New volume is the original volume−inflow+outflow

E. Repeat this process on each frame of the simulation

Neighbor Selection.

In a grid-based 2D fluid simulation, fluid can flow out of a given cell in an infinite number of directions. In some embodiments, the desired flow direction can be obtained from the flow texture generated above. However, in some embodiments, because the simulation is performed on a grid, in these embodiments there are only 8 neighboring cells into which the fluid can move. Thus, if the flow direction is not perfectly aligned to one of the 8 angles, we can: quantize the flow direction into one of 8 possibilities, and/or distribute the fluid over multiple neighbors.

If the quantization embodiment is used, naive quantization can result in fluid only being able to move in 8 directions, which may result in severe artifacts. To address this, we can adapt an error-diffusion approach based on the patterns generated by a Bresenham line algorithm to choose neighbors such that, over a distance of several texels, 8-directional flow can average out to approximate the correct direction. Background information on Bresenham's line algorithm can be found on wikipedia's Oct. 23, 2018 page for "Bresenham's line algorithm" (https://en.wikipedia.org/wiki/Bresenham %27s_line_algorithm), which is herein incorporated by reference.

1. Here is an example Bresenham overview:

A. For a line between 0-45 degrees, the Bresenham algorithm can "walk" along the X axis and choose, at each step, whether the Y value should increment or not. For example:

The algorithm can "walk" along the X axis, drawing points in succession, while keeping a running tally of the current point's distance from the intended line (e.g., its error).

At each step, a new pixel can be drawn either immediately adjacent to the previous pixel, or diagonally upwards. The decision can be made based on the current error value.

B. For lines outside the 0-45 degree range:

The algorithm can feature an 8-way symmetry. All other angles can be drawn by either swapping the X/Y values or inverting them, without changing the underlying approach.

2. Given the Bresenham-based information, we can use the same error-diffusion technique to determine which direction fluid should flow.

3. An example naive approach is as follows:

A. Starting from the edge of the texture, we can walk along the dominant axis accumulating the error value until we reach the coordinate of the current cell. We can then use the error to determine whether the flow should choose the adjacent neighbor or the diagonal neighbor.

B. This can require a for-loop with a length that varies from cell to cell, and which can increase with the grid resolution. When implemented in a fragment shader, this can work but may be highly inefficient.

4. An example accelerated approach is as follows:

A. The above Bresenham-based algorithm can make a binary choice (e.g., flow to adjacent or diagonal neighbor) based on: the desired flow direction, and/or the 2D coordinates of the cell in question.

B. If we restrict angles to the 0-45 degree range, only the horizontal axis of the 2D coordinate may be needed.

C. Thus, within the 0-45 degree range, the decision can be a function of only two variables: flow angle (e.g., which can range continuously from 0 to 45), and a 1D coordinate (e.g., which can range discretely from 0 to the width of the grid).

D. If we then quantize the flow angle into some arbitrary resolution, we can pre-calculate the decision and store the result in a 2D lookup table.

E. Storing this lookup table as a texture, we can replace the whole for-loop error accumulation step with a single texture sample, with UV coordinates derived from the cell coordinate and the (e.g., quantized) angle.

F. For angles outside the 0-45 range, thanks to the Bresenham algorithm's symmetry we can use the same lookup table for the other 7 octants, by swapping or mirroring the coordinates used to perform the lookup.

G. Thus, while quantization of the flow angle does introduce artifacts, the effective quantization resolution can be about eight times the lookup table's resolution. Thus, for example, a 512×512 lookup table texture can allow for a 512×512 simulation grid with ~4,096 possible flow directions, which is more than enough to eliminate any visible artifacting.

Softbody Tissue

Figure 4:
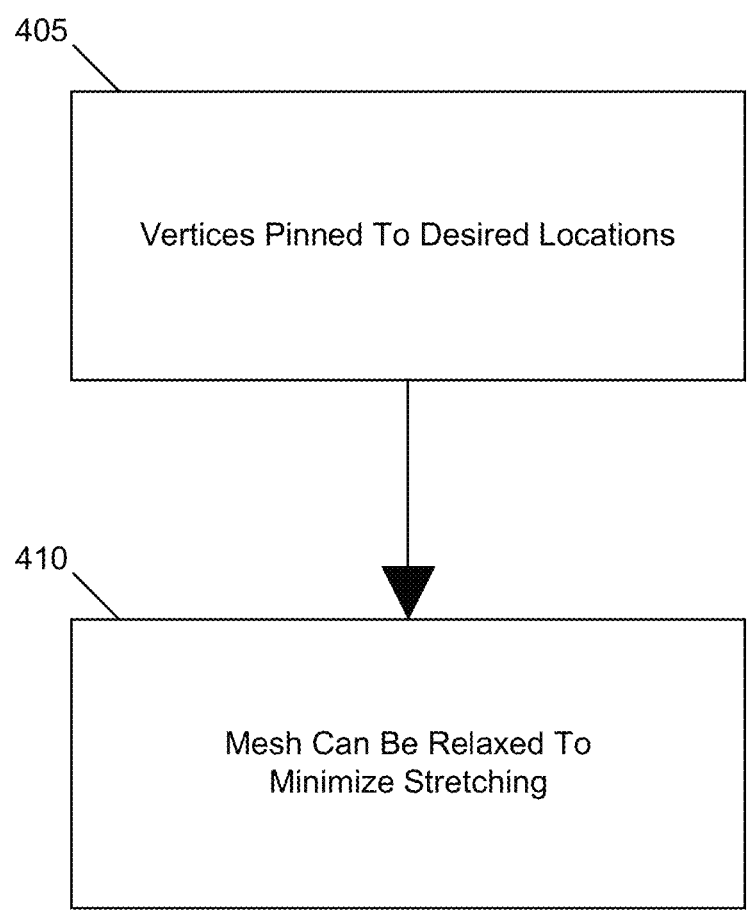
FIG. 4 illustrates a method of softbody tissue simulation, according to an embodiment.

FIG. 4 illustrates a method of softbody tissue simulation, according to embodiments of the invention. In 405, vertices can be pinned to desired positions. In 410, the mesh can be relaxed (e.g., to minimize stretching).

Pin Vertices to Desired Positions.

Vertices that need to be moved to specific positions via gameplay can be "pinned" in place. Pinned positions can be stored in a texture, as vector displacements relative to the base positions. In addition, the state of the softbody system can be stored as another texture containing vector displacements relative to the base positions. Pinning can be accomplished via two different methods, depending on needs:

A. "Grabbing". For grabbing tools (e.g., forceps), we may wish to allow clusters of vertices to be "grabbed" and dragged to arbitrary locations. The following procedure may be used:

1. Two points can be placed in space, and can be termed the "anchor" and "handle".

2. The anchor can have an associated sphere of influence. Thus, every vertex within the sphere can be moved as the handle changes position. This can be accomplished by taking the vector that points from the anchor to the handle, and writing this value to the pinned offsets texture for every texel within the anchor's sphere of influence.

B. "Sliding". For other objects (e.g., camera, tool arms, and lasso), one may wish to push the mesh out of their way without grasping or pulling it. Given that the mesh is roughly cylindrical, any direction perpendicular to the central axis can be considered as "pointing away" from the center of the tube. In some embodiments, physics calculations can be performed. In other embodiments, the following procedure can be used:

1. The vertices can be displaced outwards from the central axis until they are further from the center than any sliding object.
2. To obtain the displaced vertex position, we can represent all sliding objects as signed distance functions (SDFs), and perform volume raymarching (or ray casting) from outside the mesh, towards the center of the cylinder. For background information on raymarching, see wikipedia's Oct. 23, 2018 page on "Volume Ray Casting" (https://en.wikipedia.org/wiki/Volume_ray_casting), which is herein incorporated by reference. For background information on SDF's, see wikipedia's Oct. 23, 2018 page on "Signed distance functions" (https://en.wikipedia.org/wiki/Signed_distance_function), which is herein incorporated by reference. For background information on Ray Casting, see wikipedia's Oct. 23, 2018 page on "Ray Casting" (https://en.wikipedia.org/wiki/Ray_casting), which is herein incorporated by reference.
3. We can then find the line perpendicular to the tube's center axis that passes through the vertex in question.
4. We can choose a point along this line that is some arbitrarily-selected distance from the tube center, and assume that this point is outside of the tube.
5. We can use raymarching from this point back along the line towards the tube center, stopping once the ray either strikes an SDF, or reaches the original vertex position.
6. If the ray struck an SDF, we can write that position to the pinning texture.

Iteratively Relax the Mesh to Minimize Stretching.

The mesh can comprise numerous types (e.g., flat, concave, concave tube). The mesh can be relaxed in order to minimize stretching. In some embodiments, the relaxing can be iterative, explicit, implicit, and/or Gaussian. Any one or any combination of these methods can be used in order to converge to a final, relaxed, smooth mesh.

The approaches described herein comprise a simple explicit method, which can be done by iterative averaging via gaussian or other kernel. Implicit solvers, which can converge to the result in fewer iterations (e.g., as few as one), can also be used to achieve this.

If a texel is pinned, we can write the pinned offset to the softbody offset texture. If a texel is not pinned, we can take the average of the 8 neighbors' offsets, and use this as the new offset value. In addition, we can add a small offset back towards the base position, modulated by an aesthetically chosen scalar (or similar heuristic). This can effect a behavior similar to a restitution force, which can ensure that the mesh returns to its original shape after being deformed, and can prevent the relaxation step from smoothing out the details in the base mesh. Over a large number of iterations, this approach can converge on a shape that minimizes stretching of the mesh. When rendering the mesh, we can add the softbody offsets (and/or fluid offsets) to the base positions to obtain the final vertex positions. In this way, we can simulate a fluid flow and use the offsets to shift the start of the simulation (e.g., the reading of the frames) back and forth to allow adjustments without the need to recalculate everything.

Example Code Embodiments

Figure 8C:
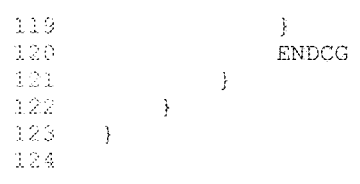
Figure 11B:
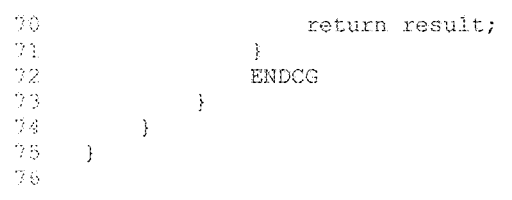

FIGS. 5-12 illustrate example source code utilized in fluid simulation, according to embodiments of the invention FIG. 5 illustrates example source code utilized for Bresenham offsets. FIG. 6 illustrates example source code utilized for fluid simulation. FIG. 7 illustrates example source code utilized for fluid advection. FIG. 8 illustrates example source code utilized for fluid blur. FIG. 9 illustrates example source code utilized for fluid diffusion. FIG. 10 illustrates example source code utilized for fluid flow. FIG. 11 illustrates example source code utilized for fluid smear. FIG. 11 illustrates example source code utilized for init fluid.

FIGS. 13-17 illustrate various source code utilized in softbody tissue simulation, according to an embodiment. FIG. 13 illustrates example source code utilized for a late manipulator. FIG. 14 illustrates example source code utilized for a manipulator manager. FIG. 15 illustrates example source code utilized for a mesh relaxation kernal. FIG. illustrates example source code utilized for a mesh relaxation update. FIG. illustrates example source code utilized for a pinned manipulation.

Example System for Simulations

Figure 18:
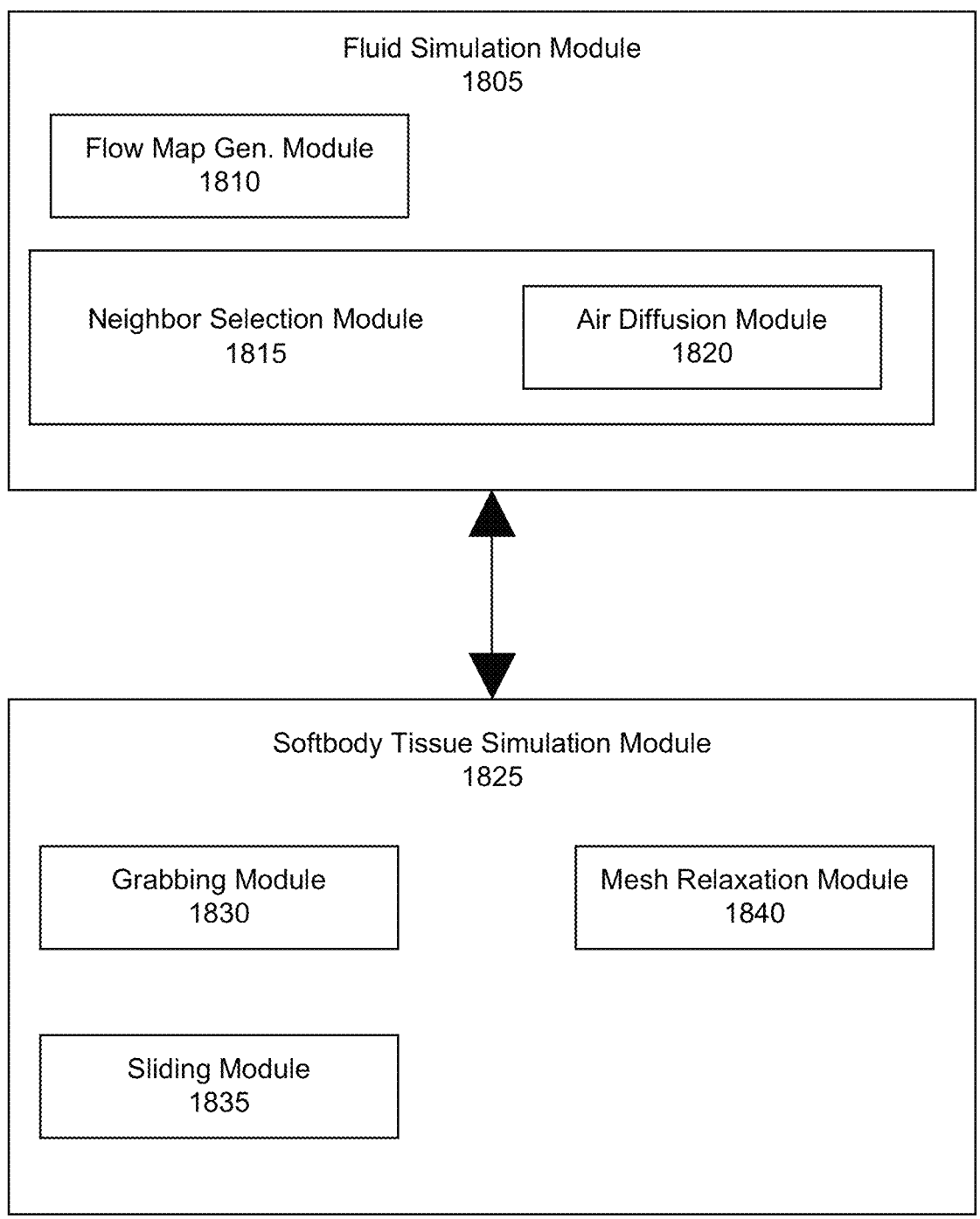
FIG. 18 illustrates a system for determining fluid simulation and/or softbody tissue simulation, according to an embodiment.

FIG. 18 illustrates a system for determining fluid simulation and/or softbody tissue simulation, according to an embodiment. FIG. 18 comprises a fluid simulation module 1805, which comprises a flow map generation module 1810, a neighbor selection module 1815, or an air diffusion module 1820, or any combination thereof. FIG. 18 also comprises a softbody tissue simulation module 1825, which comprises: a grabbing module 1830, a sliding module 1835, a mesh relation module 1840, or any combination thereof.

Example Images

Figure 19A:
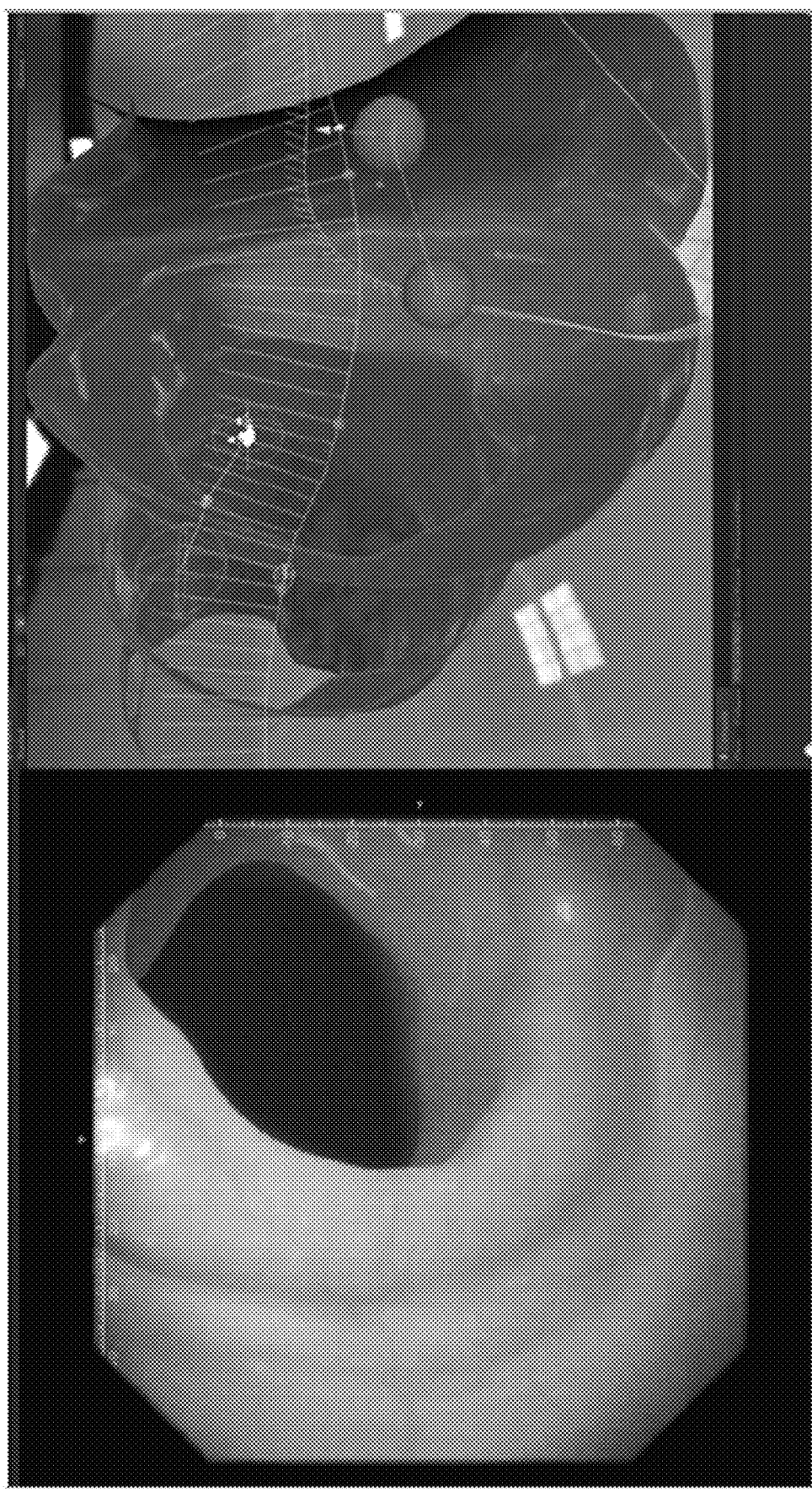
FIGS. 19A-19B, 20A-20B, 21A-21B, 22A-22B, 23-27, and 28A-28B illustrate multiple example images (e.g., based on video), according to embodiments of the invention.
Figure 19B:
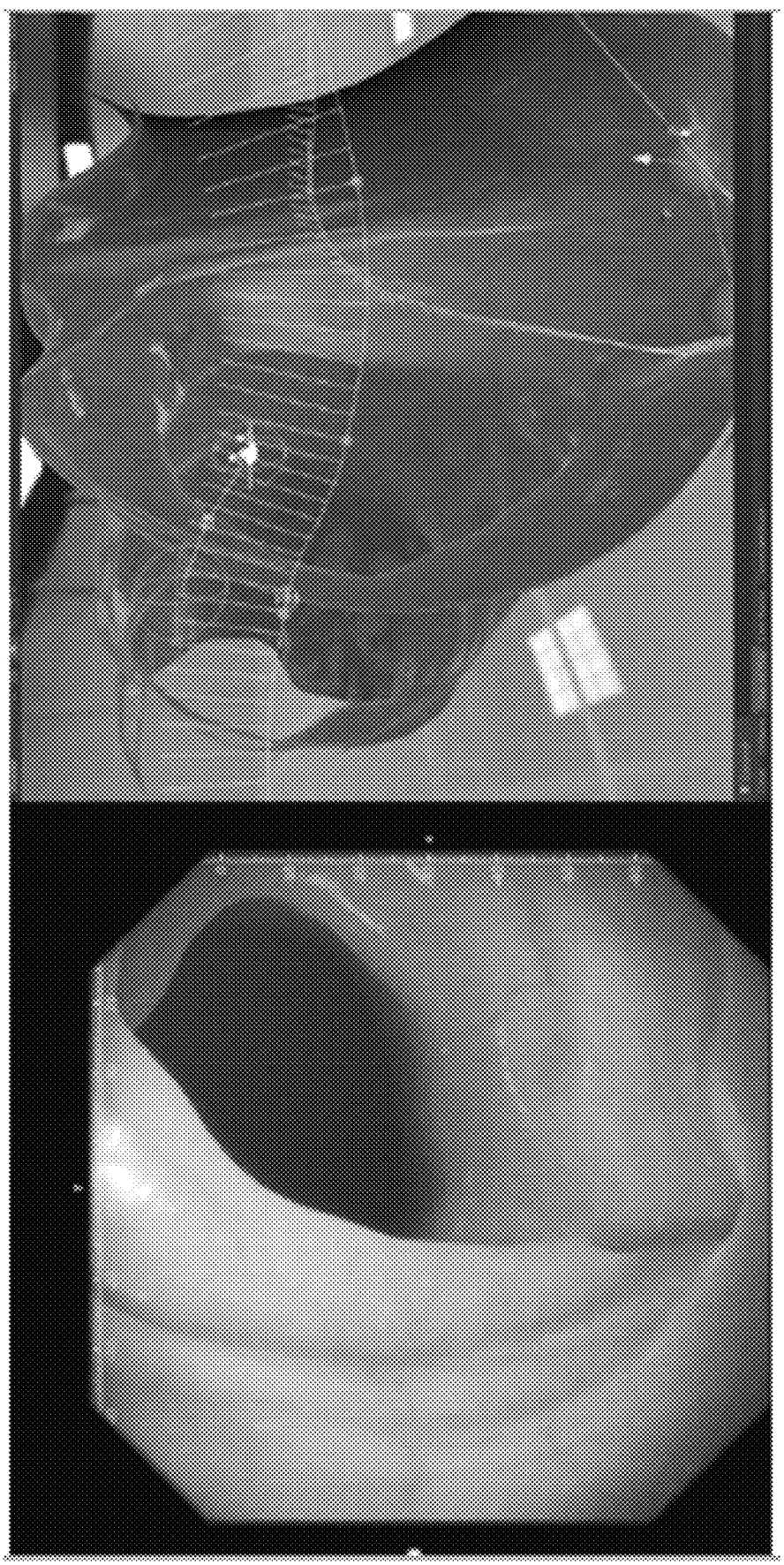
Figure 20A:
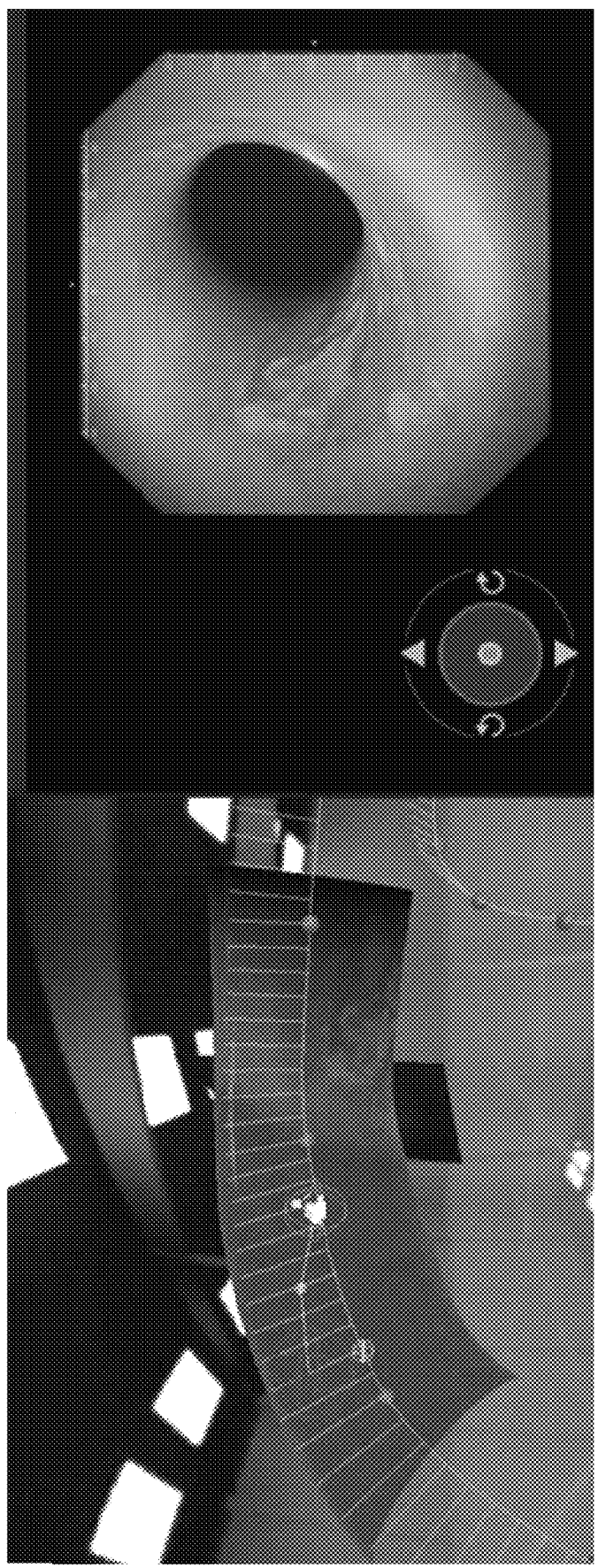
Figure 20B:
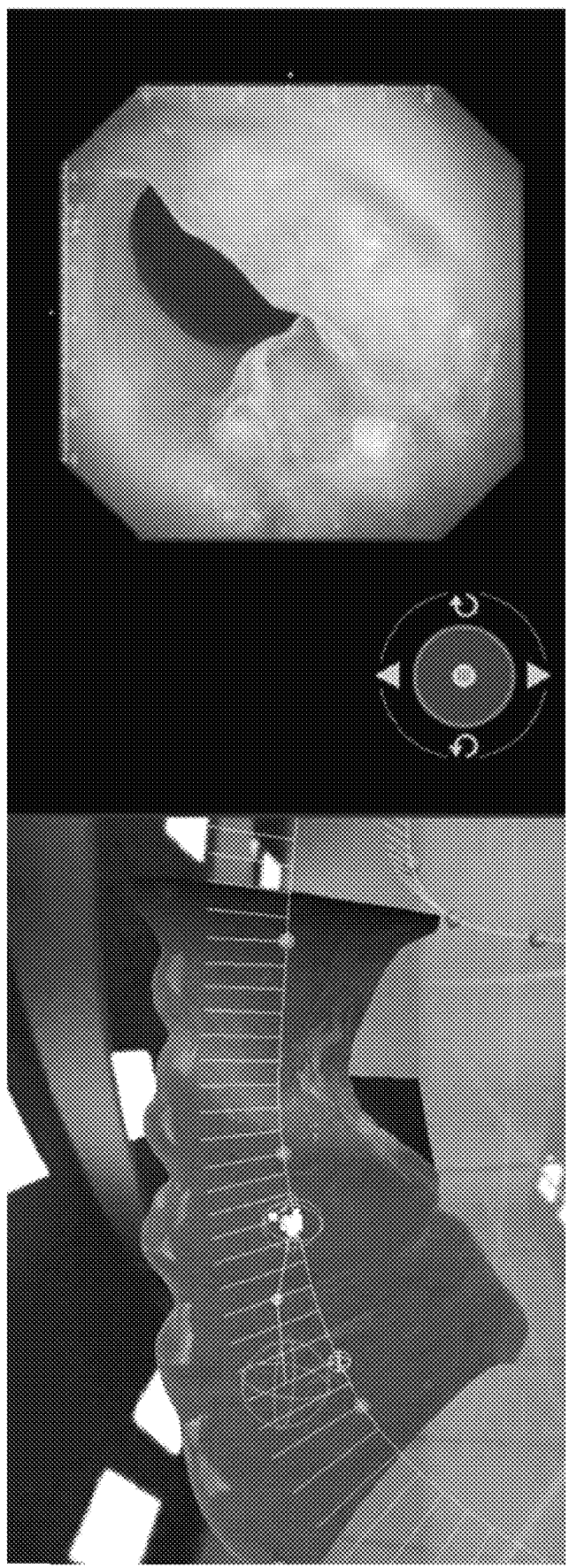
Figure 21A:
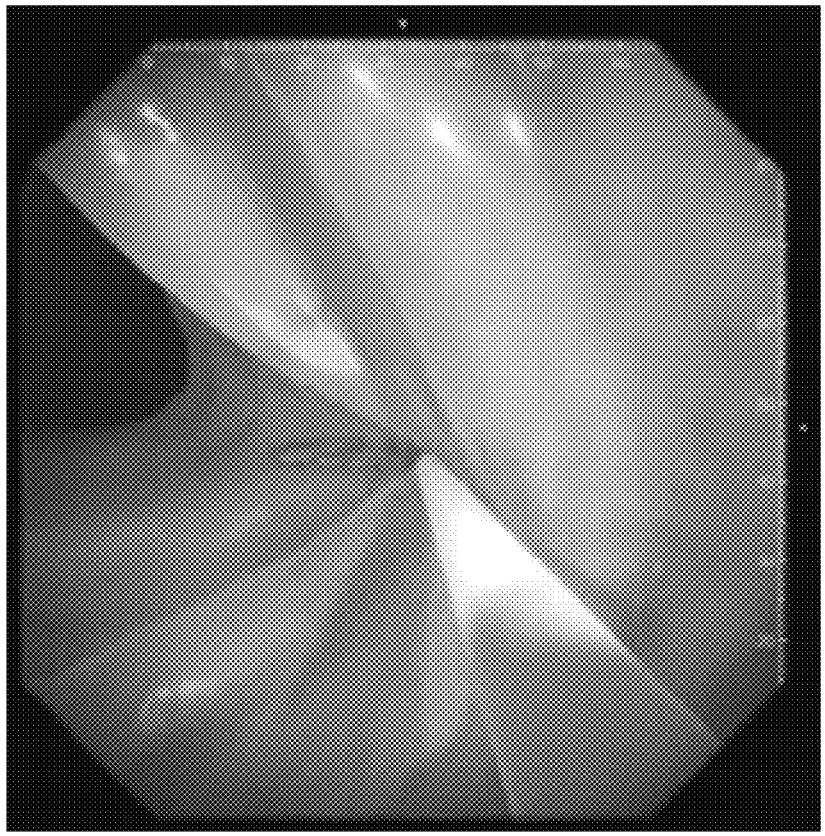
Figure 21B:
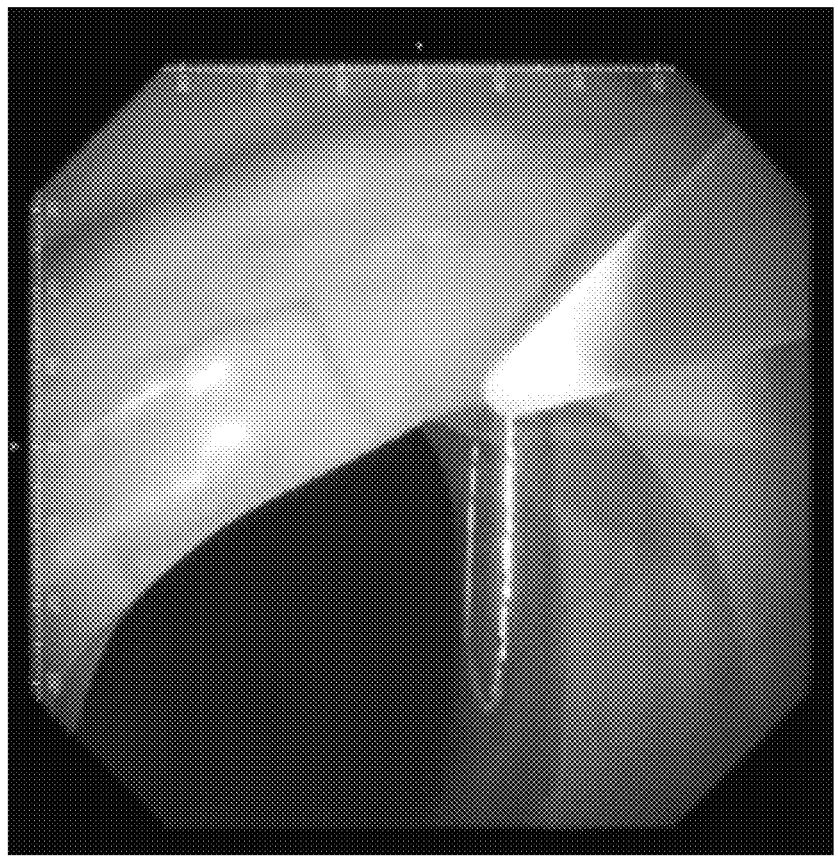
Figure 22A:
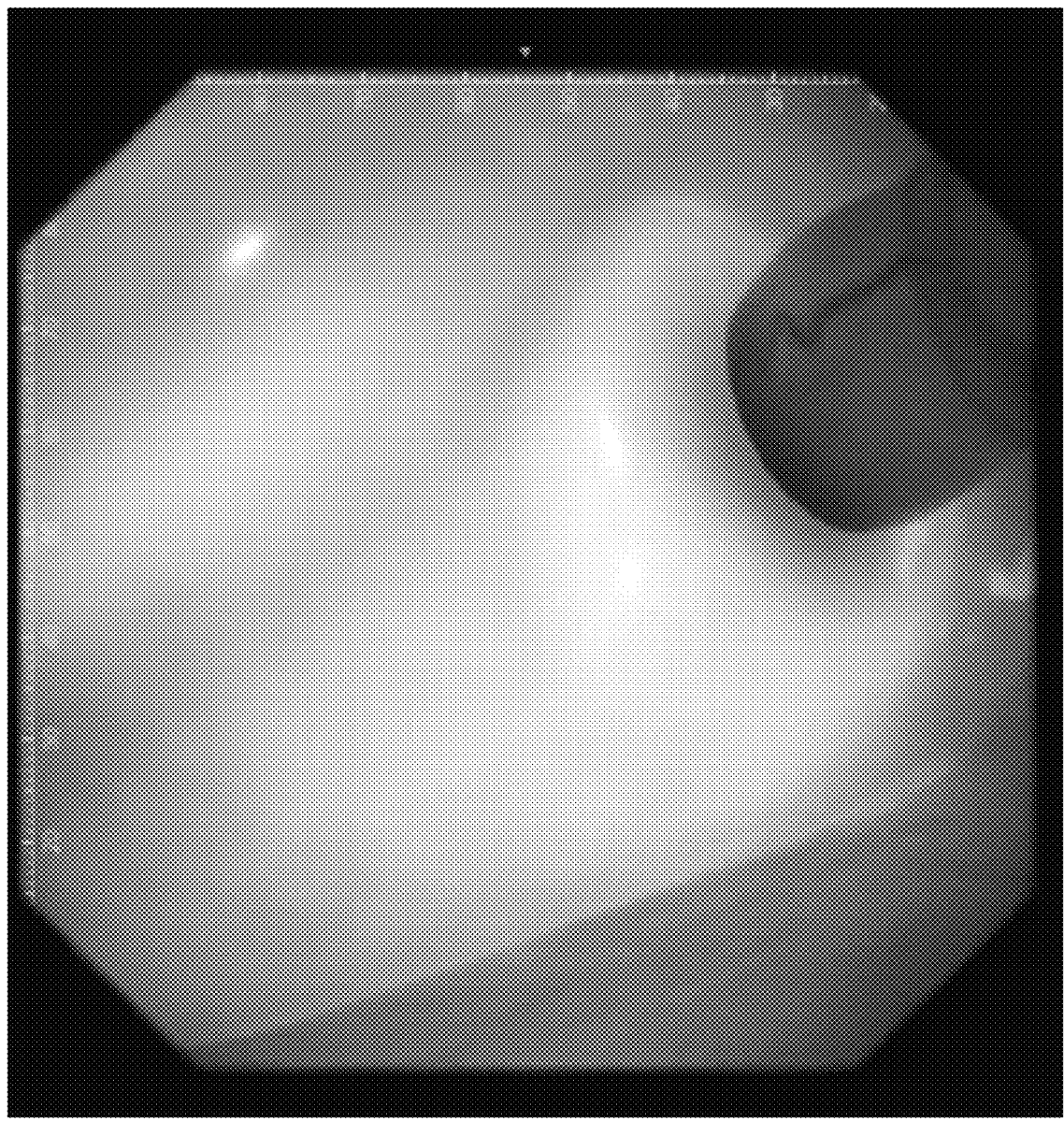
Figure 22B:
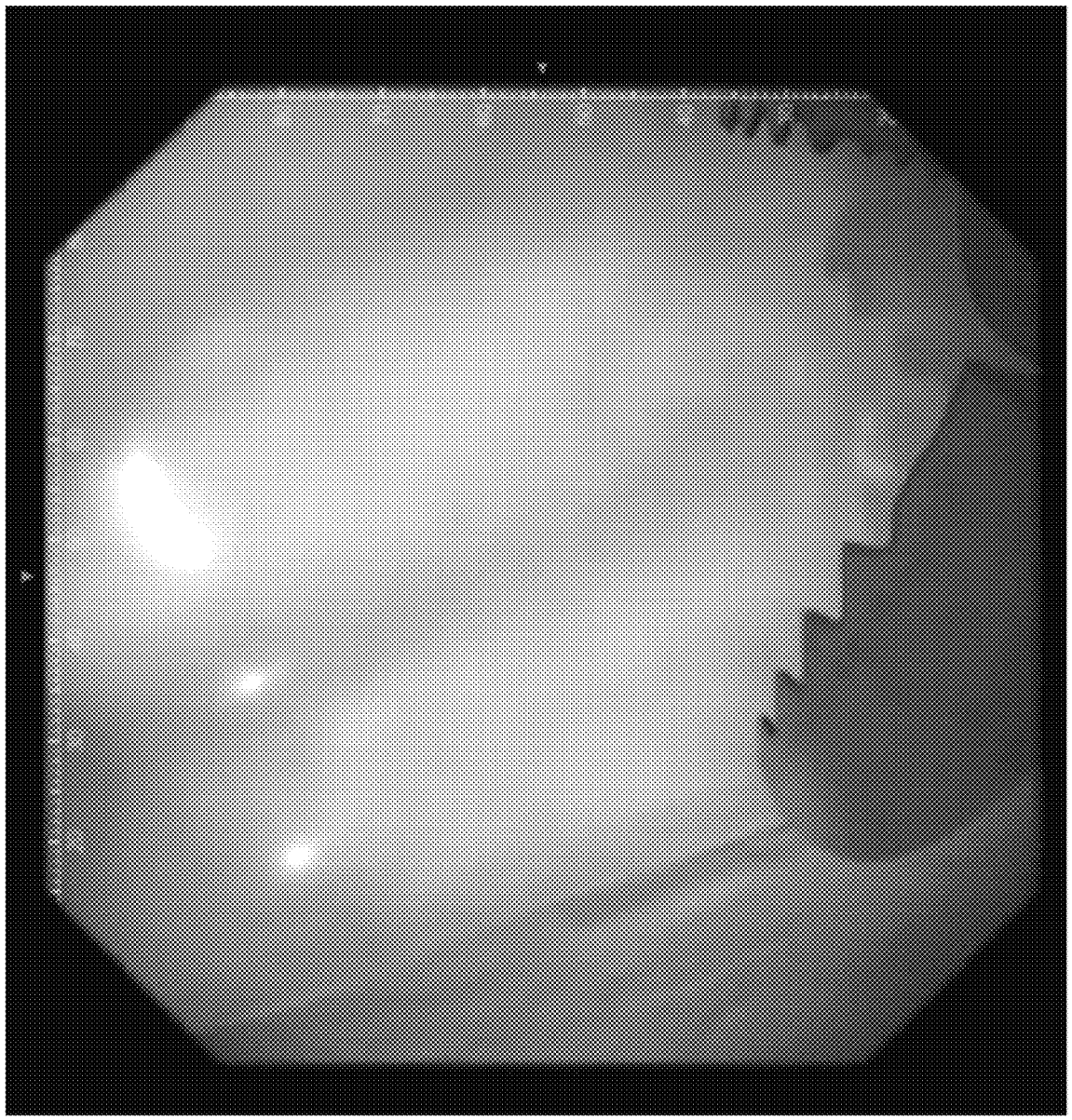
Figure 23:
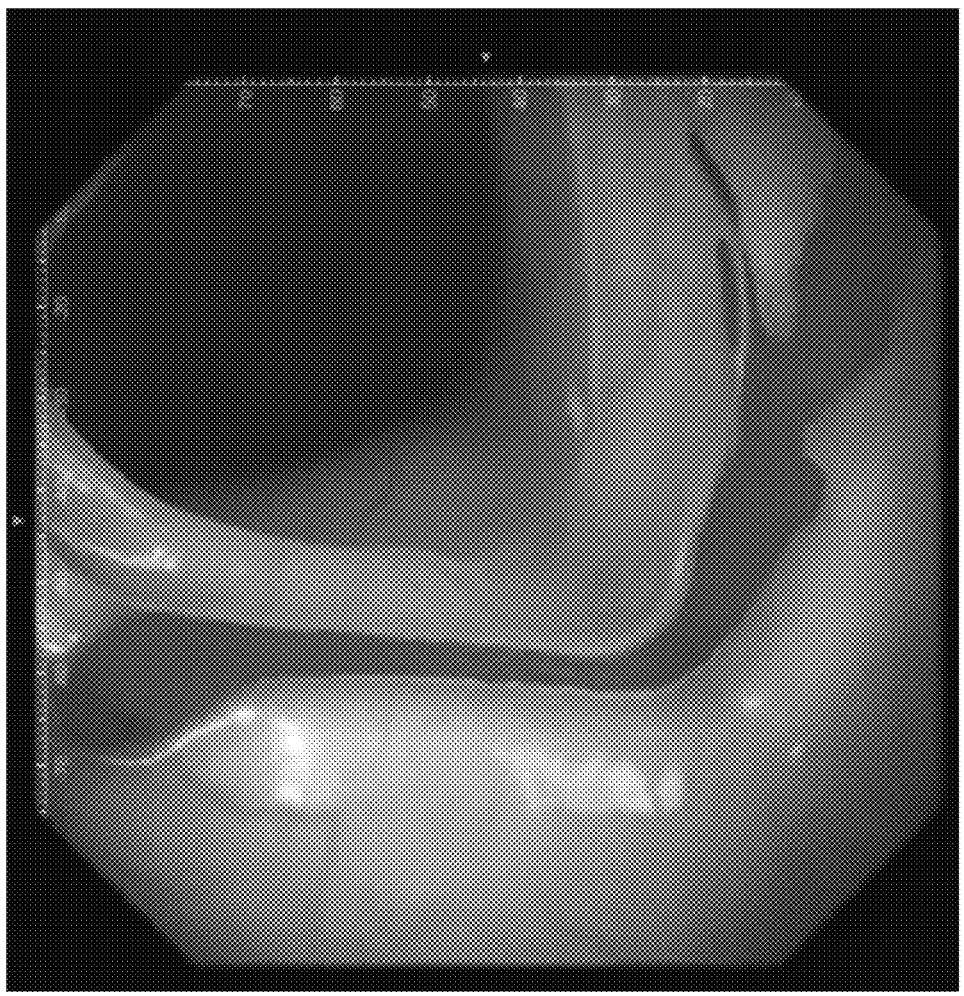
Figure 24:
Figure 25:
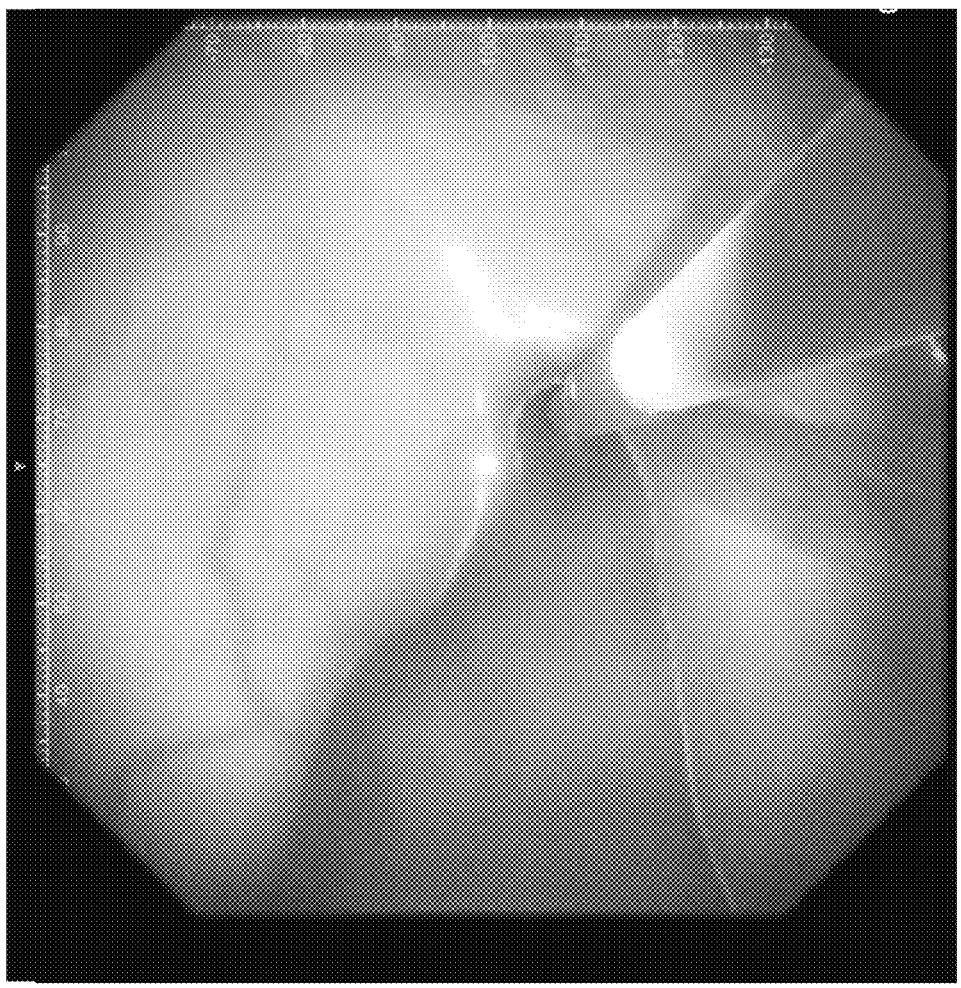
Figure 26:
Figure 27:
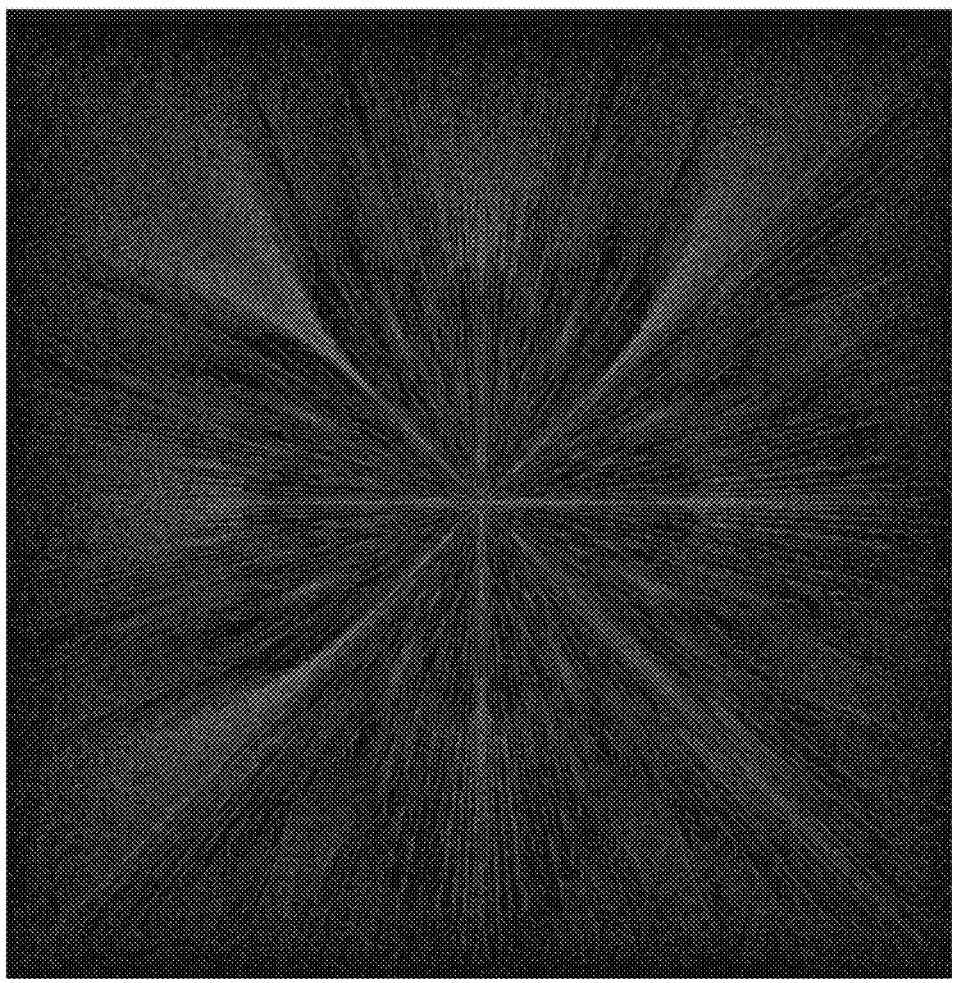
Figure 28A:
Figure 28B:
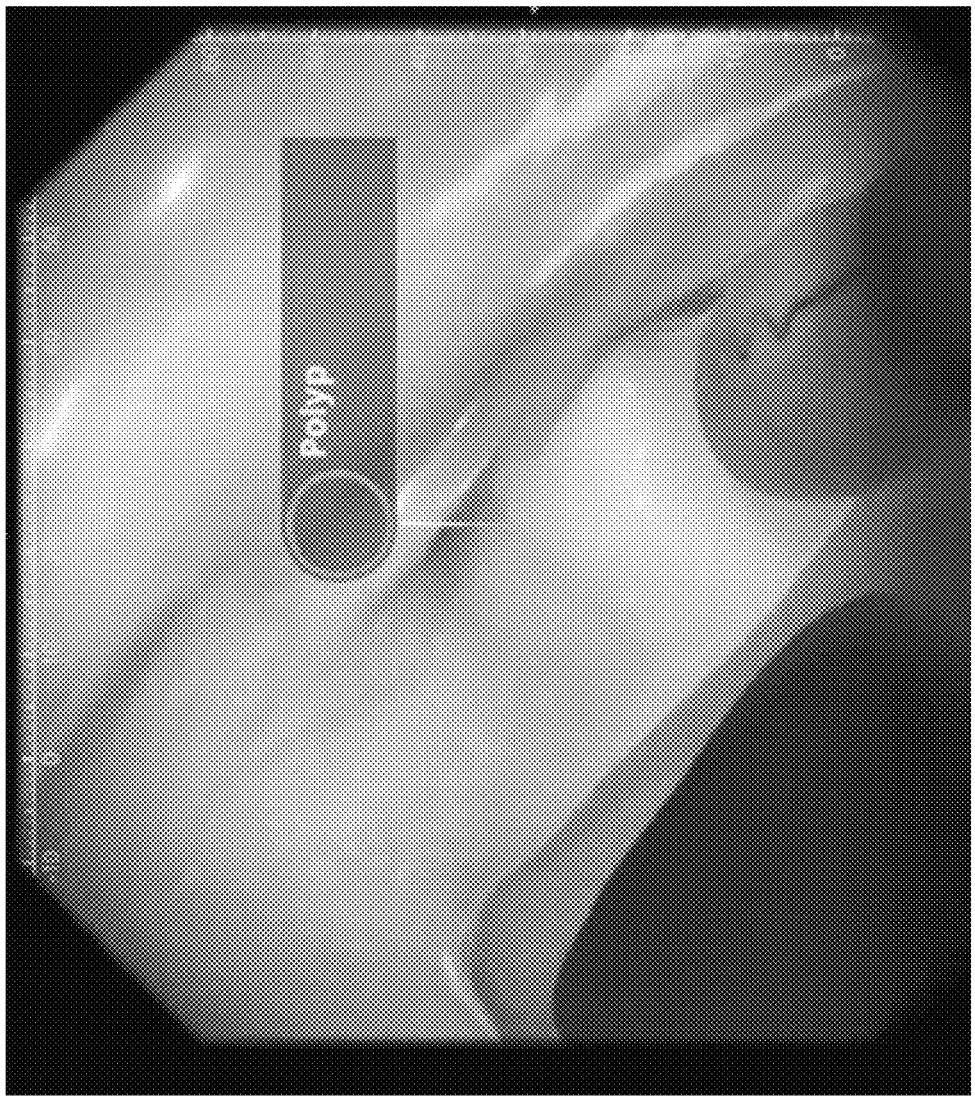

FIGS. 19A-28 illustrate multiple example images (e.g., which can be based on video), according to embodiments of the invention. FIGS. 19A-19B illustrates a relaxation solver (e.g., with blue manipulators). FIG. 20 illustrates a displaced bent tube. FIG. 21 illustrates sliding. FIGS. 22 and 28 illustrates pinning. FIGS. 23-24 illustrate fluid flow. FIG. 25 illustrates tissue/fluid interaction. FIG. 26 illustrates a displaced fluid surface. FIG. 27 illustrates advection flow along a Bresenham line pattern.

These images represent a wide range of anatomical configurations with different topology for soft tissue. The variations can be built quickly and can support a wide range of interactions, anatomy, and topology. Recreation and iteration can be done quickly. For example, we can move a polyp around, paint disease, etc. Many types of tools that cut, freeze, burn, grab, etc. can be used.

In some embodiments, a fully displacement based pipeline can be used—for example, a tube extruded along a spline. The tube can be topologically a plane, so we don't need compute shaders. It can run in all pixel shader if needed. Doing this work in texture means we can take advantage of texel adjacency, cache-coherence, and/or fast blending hardware.

In some embodiments, displacement-based geometry using a tilestrip can we used. We can create 2 meters of anatomy just by editing this tilestrip texture, that we move along in a sliding window as you traverse the anatomy. This can be represented as layers of 3D vector mesh displacement. Those layers can be composited using blend hardware.

In some embodiments, vector-displacement based geometry can be used. For example, for inflation and/or deflation, we can blend in a blue gradient texture. After we've composited the displacement, we can project it into worldspace. We can recompute tangent frames based on relative world positions for tangent-space normal mapping and fluids.

In some softbody tissue manipulation, distance-based displacement falloff can be used. We can simply use an additional displacement map. If we want to grab something, we can add a displacement texture that displaces to the point, and then render the falloff as its own displacement map. And we can control that falloff to create stretching effects. This looks great but may only work with one influencer at a time. Thus, in some embodiments, we can use pinned geometry plus a relaxation solver. This can be a constraint-based approach. Pin verts as they are being kinematically forced to a new location. A GPU-based Iterative solver can relax the mesh to minimize stretching. All of the manipulators can be processed together at the same time into one displacement texture that is blended on top. It can be a 3D vector displacement map. The displacement vector can appears pure red because the other two axes happen to be negative. So we may have a few pinned vertices around the mesh that are directly displaced—pulled or pushed, and then the solver can smooth and relax that out which can create nice effects that can stretch the whole mesh rather than just a local area.

In some softbody tissue manipulation, raymarched SDF can be used. This can comprise GPU-computed SDF with raymarched capsules to solve the pulling vs. pushing problem (e.g., pushing may need a ton of manipulators). This way we can support arbitrarily shaped colliders. Sticky and/or slippery pinning (e.g., via an anchor location (e.g., grapping) may be used. Or, SDF raymarching (e.g., slipping) may be used.

For fluid simulation, a 3D simulation on a 2D domain can be used. Fluid stored as volumes in 2D can render texture. Volumes can displace the geometry upwards. Geometry can change the feedback into fluid simulation. Fluid texels can thus be thought of as 3D rectangular solids. Multiple fluid types can be mixed. Dynamically-composited vector displacement textures can be used, so the interaction with softbody manipulators is free.

CONCLUSION

While various embodiments have been described above, it should be understood that they have been presented by way of example and not limitation. It will be apparent to persons skilled in the relevant art(s) that various changes in form and detail can be made therein without departing from the spirit and scope. In fact, after reading the above description, it will be apparent to one skilled in the relevant art(s) how to implement alternative embodiments. For example, other steps may be provided, or steps may be eliminated, from the described flows, and other components may be added to, or removed from, the described systems. Accordingly, other implementations are within the scope of the following claims.

In addition, it should be understood that any figures which highlight the functionality and advantages are presented for example purposes only. The disclosed methodology and system are each sufficiently flexible and configurable such that they may be utilized in ways other than that shown.

Although the term "at least one" may often be used in the specification, claims and drawings, the terms "a", "an", "the", "said", etc. also signify "at least one" or "the at least one" in the specification, claims and drawings.

Finally, it is the applicant's intent that only claims that include the express language "means for" or "step for" be interpreted under 35 U.S.C. 112(f). Claims that do not expressly include the phrase "means for" or "step for" are not to be interpreted under 35 U.S.C. 112(f).

What is claimed is:

1. A method of simulating a fluid, comprising:
   determining fluid surface location information comprising a new fluid volume, the determining comprising;
   taking into account an underlying 3D object along which the fluid flows;
   determining 3D location elements for the fluid's surface;
   determining inflow and/or outflow using an air diffusion approach, wherein the air diffusion approach comprises determining inflow and/or outflow between a grid cell and neighboring grid cells using at least one of a dither pattern or a Bresenham line pattern; and
   determining a new fluid volume using the original fluid volume, the inflow and the outflow; and
   generating a fluid simulation using the location information for the fluid's surface.

2. The method of claim 1, wherein the air diffusion approach comprises distributing inflow and/or outflow between the grid cell and 4 to 8 neighboring grid cells.

3. The method of claim 1, wherein the Bresenham line pattern makes a choice for the inflow and/or the outflow based on a desired flow direction and 2D coordinates of the grid cell.

4. The method of claim 3, wherein only the horizontal axis of the 2D coordinates of the grid cell are used.

5. The method of claim 4, wherein the choice is a function of: a flow angle ranging from 0-45 degrees; and a 1D coordinate ranging from 0 to the width of the grid cell.

6. The method of claim 5, wherein the flow angle is quantized and the choice is calculated and stored in a 2D lookup table.

7. The method of claim 6, wherein the 2D lookup table is stored as a texture, with UV coordinates derived from grid cell coordinates and the quantized flow angle.

8. The method of claim 1 wherein the flow map calculated for the fluid simulation is impacted by vector displacement calculated for a soft tissue simulation.

9. A system of simulating a fluid, comprising:
   a processor configured for:
   determining fluid surface location information comprising a new fluid volume, the determining comprising;
   taking into account an underlying 3D object along which the fluid flows;
   determining 3D location elements for the fluid's surface;
   determining inflow and/or outflow using an air diffusion approach, wherein the air diffusion approach comprises determining inflow and/or outflow between a grid cell and neighboring grid cells using at least one of a dither pattern or a Bresenham line pattern; and
   determining a new fluid volume using the original fluid volume, the inflow and the outflow; and
   generating a fluid simulation using the location information for the fluid's surface.

10. The system of claim 9, wherein the air diffusion approach comprises distributing inflow and/or outflow between the grid cell and 4 to 8 neighboring grid cells.

11. The system of claim 9, wherein the Bresenham line pattern makes a choice for the inflow and/or the outflow based on a desired flow direction and 2D coordinates of the grid cell.

12. The system of claim 11, wherein only the horizontal axis of the 2D coordinates of the grid cell are used.

13. The system of claim 12, wherein the choice is a function of: a flow angle ranging from 0-45 degrees; and a 1D coordinate ranging from 0 to the width of the grid cell.

14. The system of claim 13, wherein the flow angle is quantized and the choice is calculated and stored in a 15D lookup table.

15. The system of claim 14, wherein the 2D lookup table is stored as a texture, with UV coordinates derived from grid cell coordinates and the quantized flow angle.

16. The method of claim 9, wherein the flow map calculated for the fluid simulation is impacted by vector displacement calculated for a soft tissue simulation.

\* \* \* \* \*